(12) United States Patent
Lee et al.

(10) Patent No.: US 11,038,087 B2
(45) Date of Patent: Jun. 15, 2021

(54) LIGHT EMITTING DEVICE PACKAGE AND LIGHT SOURCE APPARATUS

(71) Applicant: LG INNOTEK CO., LTD., Seoul (KR)

(72) Inventors: Tae Sung Lee, Seoul (KR); June O Song, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 421 days.

(21) Appl. No.: 16/067,484

(22) PCT Filed: Sep. 29, 2017

(86) PCT No.: PCT/KR2017/011077
§ 371 (c)(1),
(2) Date: Jun. 29, 2018

(87) PCT Pub. No.: WO2018/221789
PCT Pub. Date: Dec. 6, 2018

(65) Prior Publication Data
US 2020/0274042 A1 Aug. 27, 2020

(30) Foreign Application Priority Data

May 30, 2017 (KR) .......................... 10-2017-0067187
Jun. 29, 2017 (KR) .......................... 10-2017-0082348

(51) Int. Cl.
*H01L 33/48* (2010.01)
*H01L 33/22* (2010.01)
(Continued)

(52) U.S. Cl.
CPC ............ *H01L 33/486* (2013.01); *H01L 33/22* (2013.01); *H01L 33/382* (2013.01);
(Continued)

(58) Field of Classification Search
CPC ..... H01L 33/62; H01L 33/486; H01L 33/483; H01L 2933/0033
See application file for complete search history.

(56) References Cited

U.S. PATENT DOCUMENTS 9,472,722 B1 10/2016 Lee et al.
2002/0063301 A1* 5/2002 Hanamoto ............ H01L 33/502
257/432

(Continued)

FOREIGN PATENT DOCUMENTS

EP 2461382 A3 6/2012
EP 2806471 A1 11/2014
(Continued)

*Primary Examiner* — Feifei Yeung Lopez
(74) *Attorney, Agent, or Firm* — Birch, Stewart, Kolasch & Birch, LLP

(57) ABSTRACT

A light emitting device package can include a package body; a light emitting device disposed on the package body and including first and second electrode pads on a bottom surface of the light emitting device; a first through hole in the package body; a second through hole in the package body, in which the first through hole is separated from the second through hole, the first electrode pad of the light emitting device directly overlaps with the first through hole in the package body, and the second electrode pad of the light emitting device directly overlaps with the second through hole in the package body.

20 Claims, 26 Drawing Sheets

(51) Int. Cl.
*H01L 33/38* (2010.01)
*H01L 33/40* (2010.01)
*H01L 33/54* (2010.01)
*H01L 33/60* (2010.01)
*H01L 33/62* (2010.01)

(52) U.S. Cl.
CPC .......... *H01L 33/405* (2013.01); *H01L 33/483* (2013.01); *H01L 33/54* (2013.01); *H01L 33/60* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2011/0260186 A1 | 10/2011 | Jeong | |
| 2011/0291149 A1* | 12/2011 | Sugizaki | H01L 33/647 |
| | | | 257/99 |
| 2012/0138988 A1* | 6/2012 | Lee | H01L 33/06 |
| | | | 257/98 |
| 2014/0231858 A1* | 8/2014 | Lee | H01L 33/0093 |
| | | | 257/99 |
| 2014/0332839 A1* | 11/2014 | Choi | H01L 33/62 |
| | | | 257/99 |
| 2015/0228869 A1 | 8/2015 | Yoo et al. | |

FOREIGN PATENT DOCUMENTS

| | | |
|---|---|---|
| JP | 2014-146848 A | 8/2014 |
| KR | 10-2009-0010445 A | 1/2009 |
| KR | 10-2011-0048202 A | 5/2011 |
| KR | 10-2011-0111173 A | 10/2011 |
| KR | 10-2017-0017150 A | 2/2017 |

\* cited by examiner

LIGHT EMITTING DEVICE PACKAGE AND LIGHT SOURCE APPARATUS

CROSS REFERENCE TO THE RELATED APPLICATIONS

This application is the National Phase of PCT International Application No. PCT/KR2017/011077, filed on Sep. 29, 2017, which claims priority under 35 U.S.C. § 119(a) to Patent Application No. 10-2017-0082348, filed in Republic of Korea on Jun. 29, 2017, and Patent Application No. 10-2017-0067187, filed in Republic of Korea on May 30, 2017, all of which are hereby expressly incorporated by reference into the present application.

TECHNICAL FIELD

The embodiments relate to a semiconductor device package, a method of manufacturing the semiconductor device package, and a light source apparatus.

BACKGROUND ART

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

In addition, since a semiconductor device capable of providing a high output has been requested, studies on a semiconductor device capable of increasing an output power by applying a high-power source have been proceeding.

In addition, as for a semiconductor device package, studies on a method of improving the light extraction efficiency of a semiconductor device and improving the light intensity in a package stage have been proceeding. In addition, as for the semiconductor device package, studies on a method of improving bonding strength between a package electrode and a semiconductor device have been proceeding.

In addition, as for the semiconductor device package, studies on a method of reducing the manufacturing cost and improving the manufacturing yield by improving the process efficiency and changing the structure have been proceeding.

SUMMARY OF THE INVENTION

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

A light emitting device package according to an embodiment includes a body; a light emitting device disposed on the body; and an adhesive disposed between the body and the light emitting device, in which the body includes first and second through holes provided through the body from an upper surface to a lower surface thereof, and a first recess concavely provided in a direction directed from the upper surface of the body toward the lower surface of the body, the first recess is disposed between the first and second through holes, the adhesive is disposed in the first recess, and the light emitting device includes first and second electrodes overlapping the first and second through holes, respectively, with reference to a first direction directed from the lower surface of the body to the upper surface thereof.

According to the embodiment, the adhesive may be disposed indirect contact with the body and the light emitting device.

The light emitting device package according to the embodiment may further include a first conductive layer provided in the first through hole and disposed in direct contact with a lower surface of the first electrode; and a second conductive layer provided in the second through hole and disposed in direct contact with a lower surface of the second electrode.

The light emitting device package according to the embodiment may include: a circuit board disposed under the body and including a first pad and a second pad; a first bonding layer electrically connecting the first pad of the circuit board and the first electrode; and a second bonding layer electrically connecting the second pad of the circuit board and the second electrode.

According to the embodiment, the first bonding layer may be disposed in the first through hole and disposed in direct contact with the lower surface of the first electrode, and the second bonding layer may be disposed in the second through hole and disposed in direct contact with the lower surface of the second electrode.

According to the embodiment, the width of an upper region of the first through hole may be smaller than or equal to the width of the first electrode.

According to the embodiment, the width of the upper region of the first through hole may be smaller than or equal to the width of a lower region of the first through hole.

A light source apparatus according to the embodiment includes a substrate; a body disposed on the substrate; a light emitting device disposed on the body; and an adhesive disposed between the body and the light emitting device, in which the body includes first and second through holes provided through the body from an upper surface to a lower surface thereof, and a first recess concavely provided in a direction directed from the upper surface of the body toward the lower surface of the body, the first recess is disposed between the first and second through holes, and the adhesive is disposed in the first recess. The light emitting device may include first and second electrodes overlapping the first and second through holes, respectively, with reference to a first direction directed from the lower surface of the body to the upper surface thereof, and may include first and second conductive layers disposed in the first and second through holes and electrically connecting the first and second electrodes of the light emitting device to the substrate.

According to the embodiment, the adhesive may be disposed in direct contact with the upper surface of the body and the lower surface of the light emitting device.

According to the embodiment, the width of an upper region of the first through hole may be smaller than or equal to the width of the first electrode.

According to the embodiment, the width of the upper region of the first through hole may be smaller than or equal to the width of a lower region of the first through hole.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

The semiconductor device package according to the embodiment can provide a body having high reflectance, so that a reflector is prevented from being discolored, thereby improving the reliability of the semiconductor device package.

DETAILED DESCRIPTION OF THE EMBODIMENTS OF THE INVENTION

Hereinafter, embodiments will be described with reference to the accompanying drawings. In the description of the embodiments, in the situation that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device package and a method of manufacturing the semiconductor device package according to the embodiment will be described in detail with reference to the accompanying drawings. Hereinafter, the description will be based on a situation where a light emitting device is applied as an example of the semiconductor device.

Figure 1:
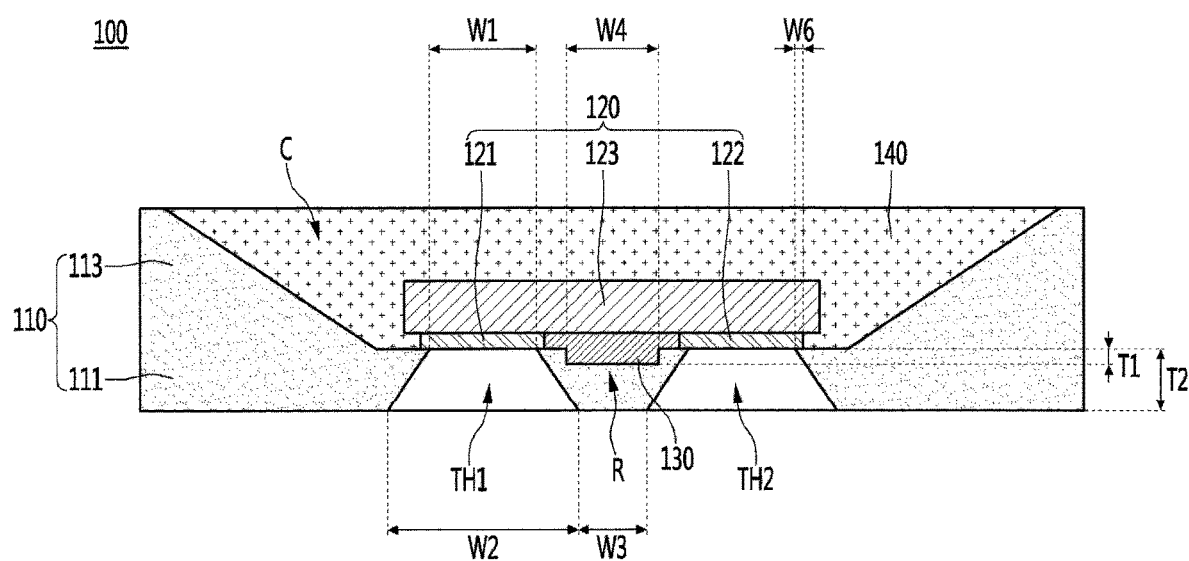
FIG. 1 is a view illustrating a light emitting device package according to an embodiment of the present invention.

First, a light emitting device package according to an embodiment of the present invention will be described with reference to FIGS. 1 and 2. FIG. 1 is a view illustrating a light emitting device package according to an embodiment of the present invention, and FIG. 2 is an exploded perspective view describing a light emitting device package according to an embodiment of the present invention.

Figure 2:
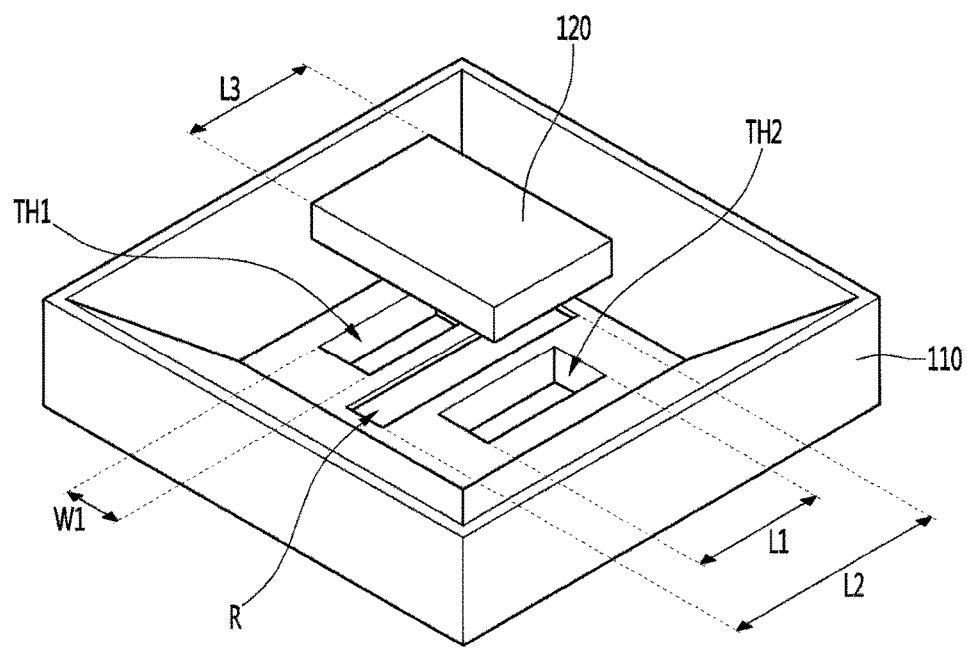
FIG. 2 is an exploded perspective view describing a light emitting device package according to an embodiment of the present invention.

As shown in FIGS. 1 and 2, the light emitting device package 100 according to the embodiment may include a body 110 and a light emitting device 120.

The body 110 may include a mounting part 111 and a reflective part 113. The reflective part 113 may be disposed on the mounting part 111. The reflector 113 may be disposed on a periphery of an upper surface of the mounting part 111. The reflective part 113 may provide a cavity C on the upper surface of the mounting part 111.

In other words, the mounting part 111 may be referred to as a lower body, and the reflective part 113 may be referred to as an upper body.

The reflective part 113 may reflect light emitted from the light emitting device 120 in an upward direction. The reflective part 113 may be inclined with respect to the upper surface of the mounting part 111.

The body 110 may include the cavity C. The cavity may include a bottom surface and a side surface inclined to the upper surface of the body 110 from the bottom surface.

For example, the body 110 may be formed of at least one selected from the group including polyphthalamide (PPA), polychloro tri phenyl (PCT), liquid crystal polymer (LCP), polyamide 9T (PA9T), silicone, epoxy molding compound (EMC), silicon molding compound (SMC), ceramic, photo sensitive glass (PSG), sapphire (Al2O3), and the like. In addition, the body 110 may include a high refractive filler such as $TiO_2$ and $SiO_2$.

According to the embodiment, the light emitting device 120 may include a first electrode 121, a second electrode 122, and a semiconductor layer 123.

The semiconductor layer 123 may include a first conductive semiconductor layer, a second conductive semiconductor layer, and an active layer disposed between the first conductive semiconductor layer and the second conductive semiconductor layer. The first electrode 121 may be electrically connected to the first conductive semiconductor layer. In addition, the second electrode 122 may be electrically connected to the second conductive semiconductor layer.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

The first electrode 121 and the second electrode 122 may be provided in a single layer or multiple layers using at least one material or an alloy selected from the group including Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

In addition, as shown in FIGS. 1 and 2, the light emitting device package 100 according to the embodiment may include a first through hole TH1 and a second through hole TH2.

The body 110 may include the first through hole TH1 that passes from a bottom surface of the cavity C through a lower surface of the body 110. The body 110 may include the second through hole TH2 provided through from the bottom surface of the cavity C through the lower surface of the body 110.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

The first through hole TH1 and the second through hole TH2 may be spaced apart from each other. The first through hole TH1 and the second through hole TH2 may be spaced apart from each other under the lower surface of the light emitting device 120.

According to the embodiment, the width W1 of an upper region of the first through hole TH1 may be less than or equal to the width of the first electrode 121. In addition, the width of an upper region of the second through hole TH2 may be less than or equal to the width of the second electrode 122. Accordingly, the light emitting device and the body 110 of the light emitting device package may be more firmly attached to each other.

The distance W6 from the upper region of the second through hole TH2 to a side end of the second electrode 122 may be tens of micrometers. For example, the distance W6 from the upper region of the second through hole TH2 to the side end of the second electrode 122 may be in the range of 40 micrometers to 60 micrometers.

When the distance W6 from the upper region of the second through hole TH2 to the side end of the second electrode 122 is 40 micrometers or more, a process margin may be ensured to prevent the second electrode 122 from being exposed at the bottom surface of the second through hole TH2.

When the distance W6 from the upper region of the second through hole TH2 to the side end of the second electrode 122 is 60 micrometers or less, the area of the second electrode 122 exposed to the second through hole TH2 may be ensured, and the resistance of the second electrode 122 exposed by the second through hole TH2 may be lowered, so that a current injection into the second electrode 122 exposed by the second through hole TH2 may be smoothly performed.

In addition, the width W1 of the upper region of the first through hole TH1 may be less than or equal to the width W2 of a lower region of the first through hole TH1. In addition, the width of the upper region of the second through hole TH2 may be less than or equal to the width of a lower region of the second through hole TH2.

The first through hole TH1 may be provided in an inclined shape having the width gradually decreased from the lower region to the upper region of the first through hole TH1. The second through hole TH2 may be provided in an inclined shape having the width gradually decreased from the lower region to the upper region of the second through hole TH2.

However, the embodiment is not limited thereto, and the inclined surfaces between the upper and lower regions of the first and second through holes TH1 and TH2 may have inclined surfaces having different slopes and the inclined surfaces may be arranged to have a curvature. The width W3 between the first through hole TH1 and the second through hole TH2 in a lower surface region of the mounting part 111 may be hundreds of micrometers. The width W3 between the first through hole TH1 and the second through hole TH2 in the lower surface region of the mounting part 111 may be in the range of 100 micrometers to 150 micrometers.

The width W3 between the first through hole TH1 and the second through hole TH2 in the lower surface region of the mounting part 111 may be selectively spaced apart by a predetermined distance or more to prevent a short between bonding pads in the situation that the light emitting device package 100 according to the embodiment is mounted on a circuit board, a sub-mount or the like afterward.

As shown in FIGS. 1 and 2, the light emitting device package 100 according to the embodiment may include a recess R. The recess R may be concavely provided from the bottom surface of the cavity C to the lower surface of the body 110.

In addition, the inclined surfaces of the first and second through holes TH1 and TH2 arranged between the first and second electrode pads 121 and 122 may vertically overlap the recess R.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIG. 1, the light emitting device package 100 according to the embodiment may include an adhesive 130 (e.g., resin).

The adhesive 130 may be disposed in the recess R. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

The adhesive 130 may provide stable fixing strength between the light emitting device 120 and the mounting part 111. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material.

The adhesive 130 may provide stable fixing strength between the mounting part 111 and the light emitting device 120. When light is emitted to the lower surface of the light emitting device 120, the adhesive 130 may provide a light diffusion function between the light emitting device and the body. When the light is emitted from the light emitting device 120 to the lower surface of the light emitting device 120, the adhesive 130 may provide the light diffusion function, so that the light extraction efficiency of the light emitting device package 100 may be improved.

According to the embodiment, the depth T1 of the recess R may be smaller than the depth T2 of the first through hole TH1 or the depth T2 of the second through hole TH2.

The depth T1 of the recess R may be determined in consideration of the adhesive strength of the adhesive 130.

In addition, the depth T1 of the recess R may be determined by considering stable strength of the mounting part 111 and/or determined to prevent the light emitting device package 100 from being cracked due to heat emitted from the light emitting device 120.

The recess R may provide a suitable space in which a sort of underfill process may be performed under the light emitting device 120. The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness for maintaining the stable strength of the mounting part 111

For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

For example, the T2-T1 thickness may be selected to be at least 100 micrometers. This is based on the thickness of the injection process that may provide crack free in the mounting part 111.

According to the embodiment, the ratio of T2/T1 may be provided in the range of 2 to 10. For example, when the thickness of T2 is provided as 200 micrometers, the thickness of T1 may be provided in the range of 20 micrometers to 100 micrometers.

In addition, according to the embodiment, as shown in FIG. 2, the length L2 of the recess R may be longer than the length L1 of the second through hole TH2. The length L1 of the second through hole TH2 may be shorter than the length L3 of the light emitting device 120 in a minor axial direction. In addition, the length L2 of the recess R may be longer than the length L2 of the light emitting device 120 in the minor axial direction.

In the process of manufacturing the light emitting device package according to the embodiment, when the amount of the adhesive 130 provided under the light emitting device 120 excesses, an overflowing portion of the adhesive 130 adhering to the lower portion of the light emitting device 120 may move along the length L2 of the recess R (e.g., the recess can allow excess adhesive to be squeezed out for a stable fit). Accordingly, even when the amount of the adhesive 130 greater than that of design is applied, the light emitting device 120 may be stably fixed without being delaminated from the mounting part 111.

In addition, the width of the recess R may be uniformly arranged in a second direction, and may have a protrusion in a third direction. The recess R may function as an aligning key for disposing the light emitting device 120 on the mounting part 111. Accordingly, when the light emitting device 120 is disposed on the mounting part 111 through the recess R, the reference function may be provided, thereby enabling the light emitting device 120 to be disposed at a desired position.

In addition, as shown in FIG. 1, the light emitting device package 100 according to the embodiment may include a molding part 140.

The molding part 140 may be provided on the light emitting device 120. The molding part 140 may be disposed on the mounting part 111. The molding part 140 may be disposed in the cavity C provided in the reflective part 113.

The molding part 140 may include an insulating material. The molding part 140 may include a wavelength conversion unit for receiving light emitted from the light emitting device 120 to provide wavelength-converted light. For example, the molding part 140 may include a fluorescent substance, a quantum dot, and the like.

In addition, according to the embodiment, the semiconductor layer 123 may be provided as a compound semiconductor. The semiconductor layer 123 may be provided as, for example, a group II-VI or group III-V compound semiconductor. For example, the semiconductor layer 123 may include at least two elements selected from aluminum (Al), gallium (Ga), indium (In), phosphorus (P), arsenic (As), and nitrogen (N).

The semiconductor layer 123 may include the first conductive semiconductor layer, the active layer, and the second conductive semiconductor layer.

The first and second conductive semiconductor layers may be implemented using at least one of group III-V or group II-VI compound semiconductors. The first and second conductive semiconductor layers may be formed of a semiconductor material having a composition formula such as $In_xAl_yGa_{1-x-y}N$ ($0 \leq x \leq 1$, $0 \leq y \leq 1$, $0 \leq x+y \leq 1$). For example, the first and second conductive semiconductor layers may include at least one selected from the group including GaN, AlN, AlGaN, InGaN, InN, InAlGaN, AlInN, AlGaAs, GaP, GaAs, GaAsP, and AlGaInP. The first conductive semiconductor layer may be an n-type semiconductor layer doped with an n-type dopant such as Si, Ge, Sn, Se, and Te. The second conductive semiconductor layer may be a p-type semiconductor layer doped with a p-type dopant such as Mg, Zn, Ca, Sr, and Ba.

The active layer may be implemented by the compound semiconductor. The active layer may be implemented using at least one of group III-V or group II-VI compound semiconductors. When the active layer is implemented as a multi-well structure, the active layer may include well layers and barrier layers which are alternately arranged, and may be arranged using the semiconductor material having the composition formula such as $In_xAl_yGa_{1-x-y}N$ ($0 \leq x \leq 1$, $0 \leq y \leq 1$, $0 \leq x+y \leq 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

Hereinafter, a method of manufacturing the light emitting device package according to the embodiment of the present invention will be described with reference to FIGS. 3 to 6.

Upon description of the method of manufacturing the light emitting device package according to the embodiment of the present invention with reference to FIGS. 3 to 6, description overlapped with those described with reference to FIGS. 1 and 2 may be omitted.

Figure 3:
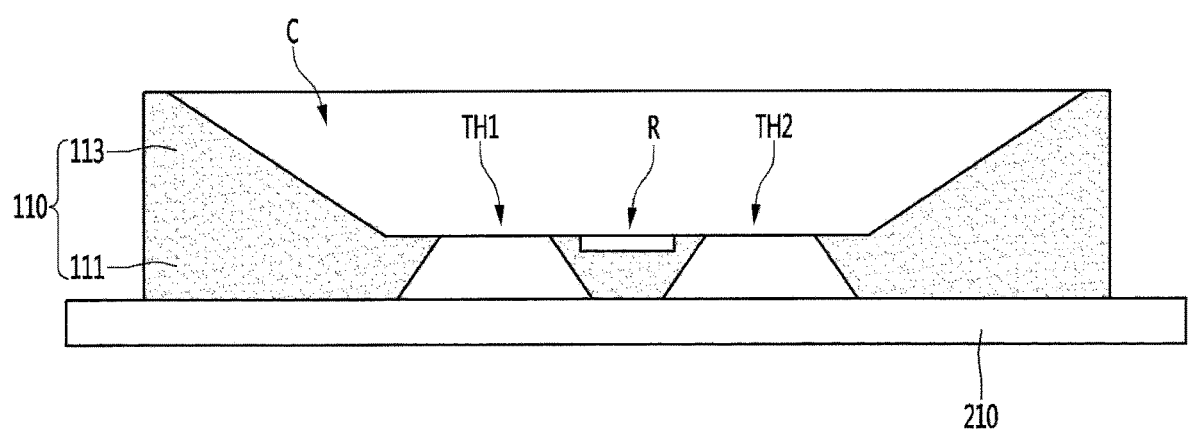
FIGS. 3 to 6 are views describing a method of manufacturing a light emitting device package according to an embodiment of the present invention.

First, according to the method of manufacturing the light emitting device package according to the embodiment of the present invention, as shown in FIG. 3, the body 110 may be provided on a temporary substrate 210.

FIG. 3 shows that only one body 110 is provided on the temporary substrate 210. However, according to the embodiment, one body 110 may be provided on the temporary substrate 210, and a plurality of bodies 110 may be disposed thereon. In addition, the one body 110 or the bodies 110 may be provided on the temporary substrate 210 through an injection process or the like.

According to the method of manufacturing the light emitting device package according to the embodiment of the present invention, a sort of chip scale package process may be applied.

For example, the temporary substrate 210 may include at least one selected from the group including polyimide-based resin, glass, acrylic-based resin, epoxy-based resin, and silicone-based resin.

The body 110 may include a mounting part 111 and a reflective part 113. The body 110 may include the first through hole TH1 and the second through hole TH2. In addition, the body 110 may include the recess R.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The first through hole TH1 and the second through hole TH2 may be spaced apart from each other.

The recess R may be provided in the mounting part 111. The recess R may be provided between the first through hole TH1 and the second through hole TH2. The recess R may be concavely provided in a direction from the upper surface of the mounting part 111 to the lower surface thereof.

Figure 4:
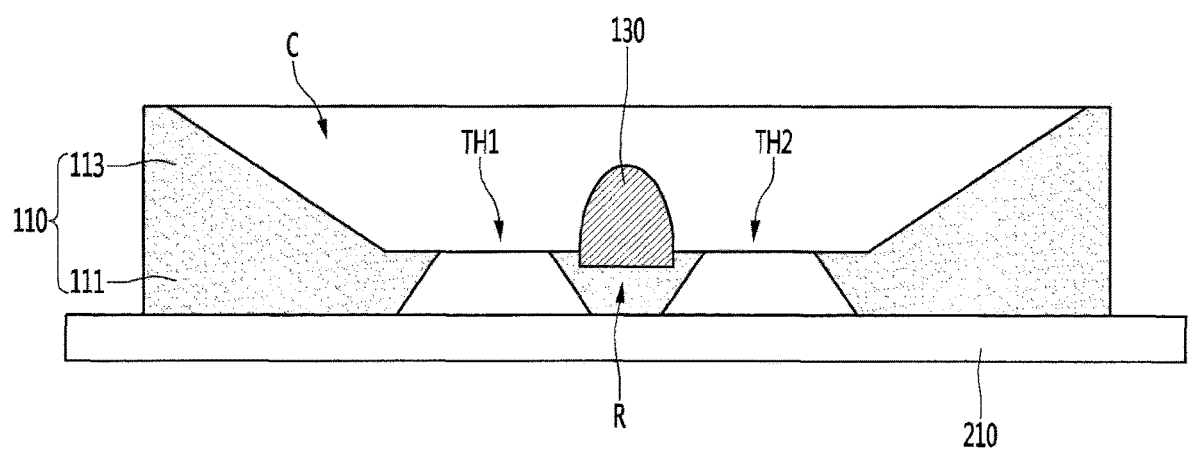

Next, according to the method of manufacturing the light emitting device package according to the embodiment, as shown in FIG. 4, the recess R may be provided with the adhesive 130.

The adhesive 130 may be provided to a region of the recess through a dotting scheme or the like. For example, the adhesive 130 may be provided in the region provided therein with the recess R, and may be provided to overflow from the recess R.

Figure 5:
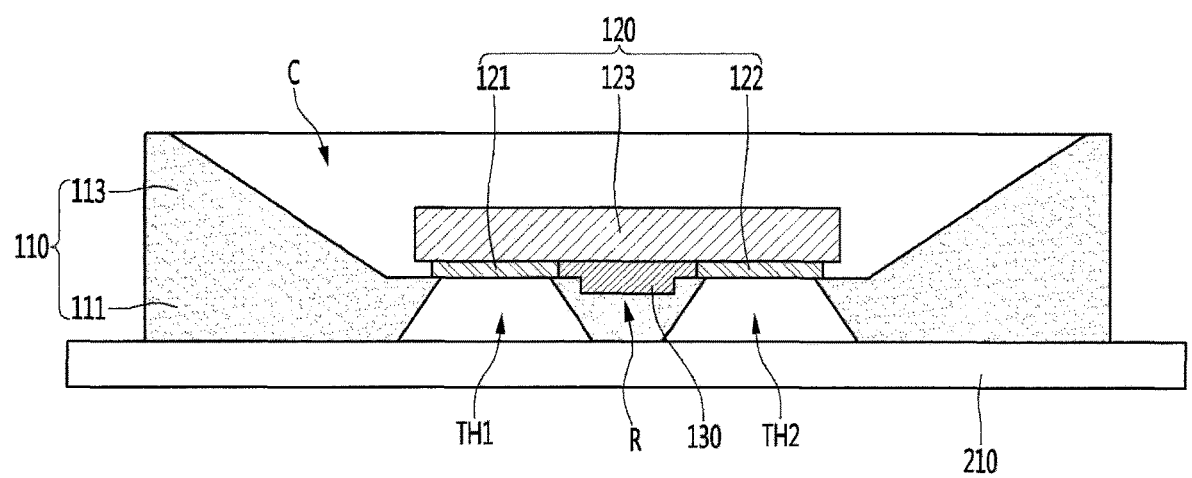

In addition, according to the method of manufacturing the light emitting device package according to the embodiment, as shown in FIG. 5, the light emitting device 120 may be provided on the mounting part 111.

According to the embodiment, the recess R may be used to function as a sort of aligning key in the process of disposing the light emitting device 120 on the mounting part 111.

The light emitting device 120 may be fixed to the mounting part 111 by the adhesive 130. A portion of the adhesive 130 provided in the recess R may be cured while moving in the directions of the first electrode 121 and the second electrode 122. Accordingly, the adhesive 130 may be provided in a wide region between the lower surface of the light emitting device 120 and the upper surface of the mounting part 111, so that the fixing strength between the light emitting device 120 and the mounting part 111 can be improved.

According to the embodiment, the first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

Figure 6:
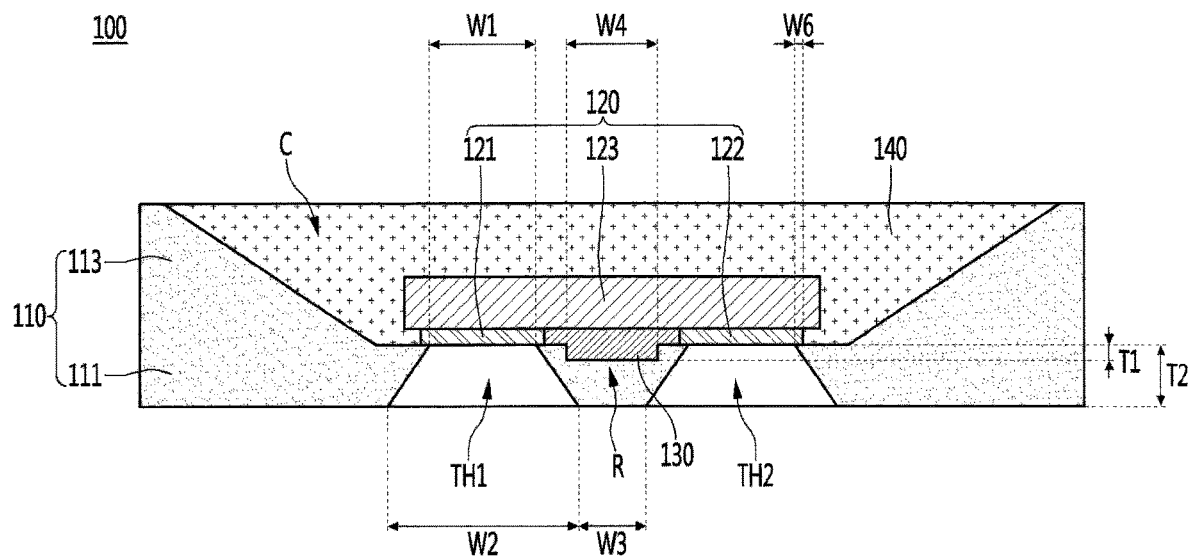

Next, according to the method of manufacturing the light emitting device package according to the embodiment, as shown in FIG. 6, the molding part 140 is provided on the light emitting device 120 and the temporary substrate 210 is removed, so that the light emitting device package 100 according to the embodiment can be provided.

As described above, in the light emitting device package 100 according to the embodiment, as shown in FIG. 6, the lower surface of the first electrode 121 may be exposed through the first through hole TH1. In addition, the lower surface of the second electrode 122 may be exposed through the second through hole TH2.

As described with reference to FIGS. 1 to 6, in the light emitting device package 100 according to the embodiment, the conventional lead frame is not applied when the body 110 is provided.

In the situation of the light emitting device package to which the conventional lead frame is applied, a process of forming the lead frame is further required. However, the method of manufacturing the light emitting device package according to the embodiment of the present invention does not require the process of forming the lead frame. Thus, according to the method for manufacturing a light emitting device package according to the embodiment of the present invention, a process time can be shortened and the material also can be reduced.

In addition, in the situation of the light emitting device package to which the conventional lead frame is applied, a plating process using silver or the like is additionally required to prevent deterioration of the lead frame, however, according to the method of manufacturing the light emitting device package according to the embodiment of the present invention, the lead frame is not required, thus an additional process such as silver plating is unnecessary. As described above, according to the method of manufacturing the light emitting device package according to the embodiment of the present invention, the manufacturing cost can be reduced and the manufacturing yield can be improved.

In the light emitting device package 100 according to the embodiment, power may be connected to the first electrode 121 through the first through hole TH1 and the power may be connected to the second electrode 122 through the second through hole TH2.

Accordingly, the light emitting device 120 may be driven by driving power supplied through the first electrode 121 and the second electrode 122. In addition, the light emitted from the light emitting device 120 may be provided in an upper direction of the body 110.

In addition, the above described light emitting device package 100 according to the embodiment may be mounted on the sub-mount, a circuit board, or the like and supplied.

Figure 7:
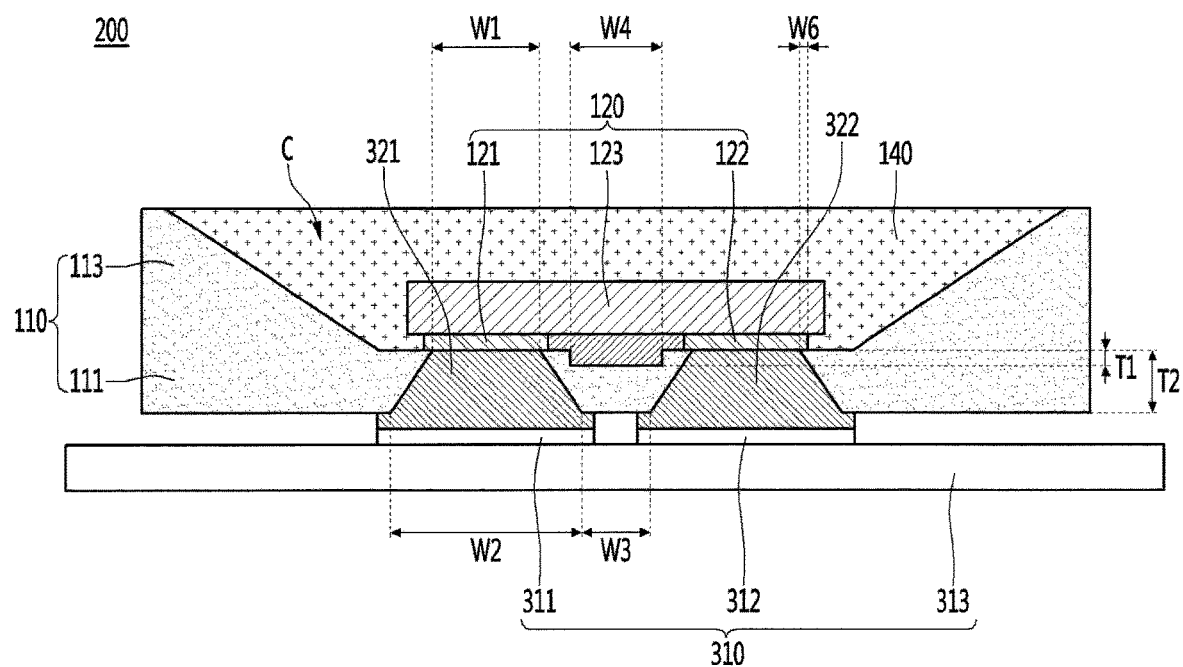
FIG. 7 is a view illustrating another example of a light emitting device package according to an embodiment of the present invention.

Hereinafter, another example of the light emitting device package according to the embodiment of the present invention will be described with reference to FIG. 7. FIG. 7 is a view illustrating another example of a light emitting device package according to an embodiment of the present invention.

The light emitting device package according to the embodiment of the present invention shown in FIG. 7 is an example in which the light emitting device package 100 described with reference to FIGS. 1 to 6 is mounted on a circuit board 310 and supplied. For example, the light emitting device package 100 mounted on the circuit board 310 may be used in a lighting apparatus.

Upon description of the light emitting device package according to the embodiment of the present invention with reference to FIG. 7, description overlapped with those described with reference to FIGS. 1 to 6 may be omitted.

As shown in FIG. 7, the light emitting device package 200 according to the embodiment may include the circuit board 310, the body 110, and the light emitting device 120.

The circuit board 310 may include a first pad 310, a second pad 320, and a substrate 313. The substrate 313 may be provided with a power supply circuit for controlling the driving of the light emitting device 120.

The body 110 may be disposed on the circuit board 310. The first pad 311 and the first electrode 121 may be electrically connected to each other. The second pad 312 and the second electrode 122 may be electrically connected to each other.

The first pad 311 and the second pad 312 may include a conductive material. For example, the first pad 311 and the second pad 312 may include at least one material or an alloy thereof selected from the group including Ti, Cu, Ni, Au, Cr, Ta, Pt, Sn, Ag, P, Fe, Sn, Zn, and Al. The first pad 311 and the second pad 312 may be provided as a single layer or multiple layers.

The body 110 may include a mounting part 111 and a reflective part 113.

The body 110 may include the first through hole TH1 and the second through hole TH2 provided through from the upper surface to the lower surface thereof in the first direction. The first through hole TH1 and the second through hole TH2 may be provided through the mounting part 111 in the first direction from the upper surface to the lower surface thereof.

The light emitting device 120 may include a first electrode 121, a second electrode 122, and a semiconductor layer 123.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The first through hole TH1 may be provided to overlap the first pad 311. The first electrode 121 and the first pad 311 may be provided to overlap each other in the vertical direction.

The second through hole TH2 may be arranged under the second electrode 122 of the light emitting device 120. The second through hole TH2 may be provided to overlap the second electrode 122 of the light emitting device 120. The second through hole TEE may be provided to overlap the second electrode 122 of the light emitting device 120 in the first direction directed from the upper surface toward the lower surface of the mounting part 111.

The second through hole TH2 may be provided to overlap the second pad 312. The second electrode 122 and the second pad 312 may be provided to overlap each other in a vertical direction.

The first through hole TH1 and the second through hole TH2 may be spaced apart from each other. The first through hole TH1 and the second through hole TH2 may be spaced apart from each other under the lower surface of the light emitting device 120.

As shown in FIG. 7, the light emitting device package 200 according to the embodiment may include a first bonding layer 321 and a second bonding layer 322.

The first bonding layer 321 may be electrically connected to the first electrode 121 in the process of mounting the body 110 on the circuit board 310.

For example, the first bonding layer 321 may be provided by inserting a bump or a bonding material provided on the first pad 311 in the direction of the first through hole TH1 during a reflow process in which the body 110 is mounted on the circuit board 310.

The first bonding layer 321 may be provided by moving the bonding material into the first through hole TH1 by a sort of capillary phenomenon or the like in the bonding process between the body 110 and the circuit board 310.

The second bonding layer 322 may be electrically connected to the second electrode 122 in the process of mounting the body 110 on the circuit board 310.

For example, the second bonding layer 322 may be provided by inserting a bump or a bonding material provided on the second pad 312 in the direction of the second through hole TH2 during the reflow process in which the body 110 is mounted on the circuit board 310.

The second bonding layer 322 may be provided by moving the bonding material into the second through hole TH2 by a sort of capillary phenomenon or the like in the bonding process between the body 110 and the circuit board 310.

The first bonding layer 321 and the second bonding layer 322 may be provided of at least one material or a selective alloy selected from the group including titanium (Ti), copper (Cu), nickel (Ni), gold (Au), chromium (Cr) tantalum (Ta), platinum (Pt), tin (Sn), silver (Ag), and phosphorus (P).

According to the embodiment, the first pad 311 of the circuit board 310 may be electrically connected to the first electrode 121 by the first bonding layer 321. In addition, the second pad 312 of the circuit board 310 may be electrically connected to the second electrode 122 by the second bonding layer 322.

In addition, according to the embodiment, the body 110 may be mounted on the circuit board 310 by eutectic bonding.

As shown in FIG. 7, the light emitting device package 200 according to the embodiment may include a recess R.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIG. 7, the light emitting device package 200 according to the embodiment may include an adhesive 130.

The adhesive 130 may be disposed in the recess R. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

The adhesive 130 may provide stable fixing strength between the light emitting device 120 and the mounting part 111. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material.

The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers. For example, the depth T1 of the recess R may be 50 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness of the mounting part 111. For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

In addition, as shown in FIG. 7, the light emitting device package 200 according to the embodiment may include a molding part 140.

The molding part 140 may be provided on the light emitting device 120. The molding part 140 may be disposed on the mounting part 111. The molding part 140 may be disposed in the cavity C provided in the reflective part 113.

As described with reference to FIG. 7, in the light emitting device package 200 according to the embodiment, the conventional lead frame is not applied when the body 110 is provided.

In the situation of the light emitting device package to which the conventional lead frame is applied, a process of forming the lead frame is further required. However, the light emitting device package according to the embodiment of the present invention does not require the process of forming the lead frame. Thus, according to the method for manufacturing a light emitting device package according to the embodiment of the present invention, a process time can be shortened and the material also can be reduced.

In addition, in the situation of the light emitting device package to which the conventional lead frame is applied, a plating process using silver or the like is additionally required to prevent deterioration of the lead frame, however, according to the light emitting device package according to the embodiment of the present invention, the lead frame is not required, thus an additional process such as silver plating is unnecessary. As described above, according to the method of manufacturing the light emitting device package according to the embodiment of the present invention, the manufacturing cost can be reduced and the manufacturing yield can be improved.

Figure 8:
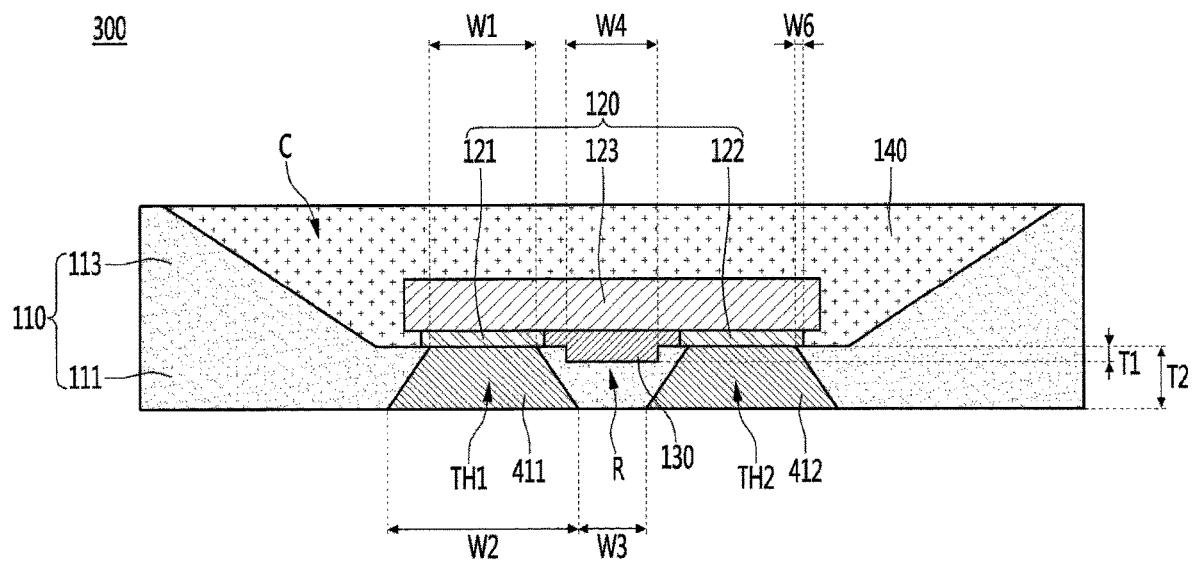
FIG. 8 is a view illustrating still another example of a light emitting device package according to an embodiment of the present invention.

In addition, FIG. 8 is a view illustrating still another example of a light emitting device package according to an embodiment of the present invention. Upon description of another example of the light emitting device package according to the embodiment of the present invention with reference to FIG. 8, description overlapped with those described with reference to FIGS. 1 to 7 may be omitted. In addition, the light emitting device package applied in FIG. 8 may be used for a lighting apparatus.

As shown in FIG. 8, the light emitting device package 300 according to the embodiment may include the body 110, the light emitting device 120, the first conductive layer 411, and the second conductive layer 412.

The body 110 may include a mounting part 111 and a reflective part 113. The reflective part 113 may be disposed on the mounting part 111. The reflector 113 may be disposed on a periphery of an upper surface of the mounting part 111. The reflective part 113 may provide a cavity C on the upper surface of the mounting part 111.

According to the embodiment, the light emitting device 120 may include a first electrode 121, a second electrode 122, and a semiconductor layer 123.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

In addition, as shown in FIG. 8, the light emitting device package 300 according to the embodiment may include a first through hole TH1 and a second through hole TH2.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

The first through hole TH1 and the second through hole TH2 may be spaced apart from each other. The first through hole TH1 and the second through hole TH2 may be spaced apart from each other under the lower surface of the light emitting device 120.

According to the embodiment, the width W1 of an upper region of the first through hole TH1 may be less than or equal to the width of the first electrode 121. In addition, the width of an upper region of the second through hole TH2 may be less than or equal to the width of the second electrode 122.

The distance W6 from the upper region of the second through hole TH2 to a side end of the second electrode 122 may be tens of micrometers. For example, the distance W6 from the upper region of the second through hole TH2 to the side end of the second electrode 122 may be in the range of 40 micrometers to 60 micrometers. The distance W6 from the upper region of the second through hole TH2 to the side end of the second electrode 122 may be provided as 50 micrometers.

In addition, the width W1 of the upper region of the first through hole TH1 may be less than or equal to the width W2 of a lower region of the first through hole TH1. In addition, the width of the upper region of the second through hole TH2 may be less than or equal to the width of a lower region of the second through hole TH2.

The first through hole TH1 may be provided in an inclined shape having the width gradually decreased from the lower region to the upper region of the first through hole TH1. The second through hole TH2 may be provided in an inclined shape having the width gradually decreased from the lower region to the upper region of the second through hole TH2.

The width W3 between the first through hole TH1 and the second through hole TH2 in a lower surface region of the mounting part 111 may be hundreds of micrometers. The width W3 between the first through hole TH1 and the second through hole TH2 in the lower surface region of the mounting part 111 may be in the range of 100 micrometers to 150 micrometers.

The width W3 between the first through hole TH1 and the second through hole TH2 in the lower surface region of the mounting part 111 may be selectively spaced apart by a predetermined distance or more to prevent a short between bonding pads in the situation that the light emitting device package 100 according to the embodiment is mounted on a circuit board, a sub-mount or the like afterward.

As shown in FIG. 8, the light emitting device package 300 according to the embodiment may include a recess R.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIG. 8, the light emitting device package 300 according to the embodiment may include an adhesive 130.

The adhesive 130 may be disposed in the recess R. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

In addition, the adhesive 130 may provide a function of diffusing light emitted to the lower surface of the light emitting device 120 after the adhesive 130 is cured between the light emitting device and the mounting part 111.

The adhesive 130 may provide stable fixing strength between the light emitting device 120 and the mounting part 111. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material.

According to the embodiment, the depth T1 of the recess R may be smaller than the depth T2 of the first through hole TH1 or the depth T2 of the second through hole TH2.

The depth T1 of the recess R may be determined in consideration of the adhesive strength of the adhesive 130. In addition, the depth T1 of the recess R may be determined by considering stable strength of the mounting part 111.

The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness for maintaining the stable strength of the mounting part 111.

For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

In addition, as shown in FIG. 8, the light emitting device package 300 according to the embodiment may include the first conductive layer 411 and the second conductive layer 412.

The first conductive layer 411 may be disposed in the first through hole TH1. The first conductive layer 411 may be disposed in direct contact with the lower surface of the first electrode 121. The first conductive layer 411 may be provided to overlap the first electrode 121 in the vertical direction.

For example, the width of the upper surface of the first conductive layer 411 may be equal to the width of the upper surface of the first through hole TH1. The width of the upper surface of the first conductive layer 411 may be equal to or smaller than the width of the first electrode 121.

The upper surface of the first conductive layer 411 may be disposed on a plane the same as the upper surface of the mounting part 111. The lower surface of the first conductive layer 411 may be provided on a plane the same as the lower surface of the mounting part 111.

The second conductive layer 412 may be disposed in the second through hole TH2. The second conductive layer 412 may be disposed in direct contact with the lower surface of the second electrode 122. The second conductive layer 412 may be provided to overlap the second electrode 122 in the vertical direction.

For example, the width of the upper surface of the second conductive layer 412 may be equal to the width of the upper surface of the second through hole TH2. The width of the upper surface of the second conductive layer 412 may be equal to or smaller than the width of the second electrode 122.

The upper surface of the second conductive layer 412 may be disposed on the same plane as the upper surface of the mounting part 111. The lower surface of the second conductive layer 411 may be provided on the same plane as the lower surface of the mounting part 111.

The first conductive layer 411 and the second conductive layer 412 may be disposed in the first through hole TH1 and the second through hole TH2, respectively, thereby providing functions to enable a current injected to the light emitting device 120 disposed on the circuit board 210 to be smooth and mount the light emitting device package 120 on the circuit board 210.

Figure 12:
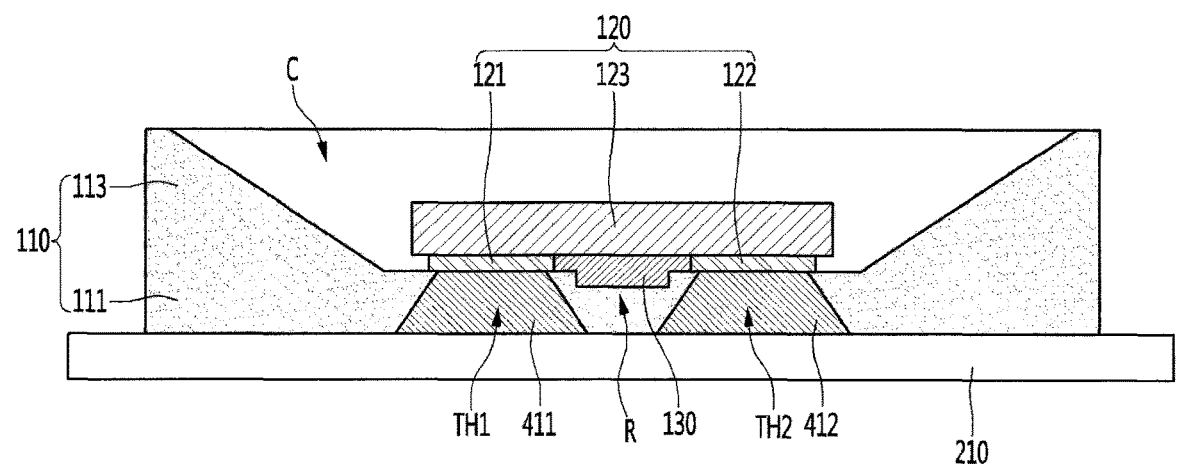

According to the embodiment shown in FIG. 12, in the first conductive layer 411 and the second conductive layer 412, a solder material may be disposed on the circuit board 210 and the light emitting device package 100 may be mounted thereon, thereby enabling the solder material to be disposed in the first through hole Till and the second through hole TH2. According to the embodiment shown in FIG. 7 and/or FIG. 14, after the first conductive layer 411 and the second conductive layer 412 are disposed in the first through hole TH1 and the second through hole TH2, respectively, the first and second bonding layers 421 and 422 and/or the first and second pads 311 and 312 may be disposed between the first and second conductive layers 411 and 412 and the circuit board 210, so that the light emitting device package 100 may be mounted on the circuit board 210.

According to the configuration of the embodiment shown in FIG. 12, the process of mounting the light emitting device package 100 on the circuit board 210 can be shortened, and costs for the process of the light emitting device package 100 can be reduced. According to the configuration of the embodiment shown in FIG. 7 and/or FIG. 14, adhesive strength between the circuit board 210 and the light emitting device package 100 can be improved. Accordingly, a user can variously configure the light emitting device package 100 mounted on the circuit board 210 according to the application field thereof.

For example, the first conductive layer 411 and the second conductive layer 412 may include one material or an alloy thereof selected from the group including Ag, Au, Pt, and the like. However, the embodiment is not limited thereto, and a material capable of ensuring a conductive function may be used.

In addition, as shown in FIG. 8, the light emitting device package 300 according to the embodiment may include a molding part 140.

The molding part 140 may be provided on the light emitting device 120. The molding part 140 may be disposed on the mounting part 111. The molding part 140 may be disposed in the cavity C provided in the reflective part 113.

Hereinafter, a method of manufacturing the light emitting device package according to the embodiment of the present invention will be described with reference to FIGS. 9 to 13.

Upon description of the method of manufacturing the light emitting device package according to the embodiment of the present invention with reference to FIGS. 9 to 13, description overlapped with those described with reference to FIGS. 1 to 8 may be omitted.

Figure 9:
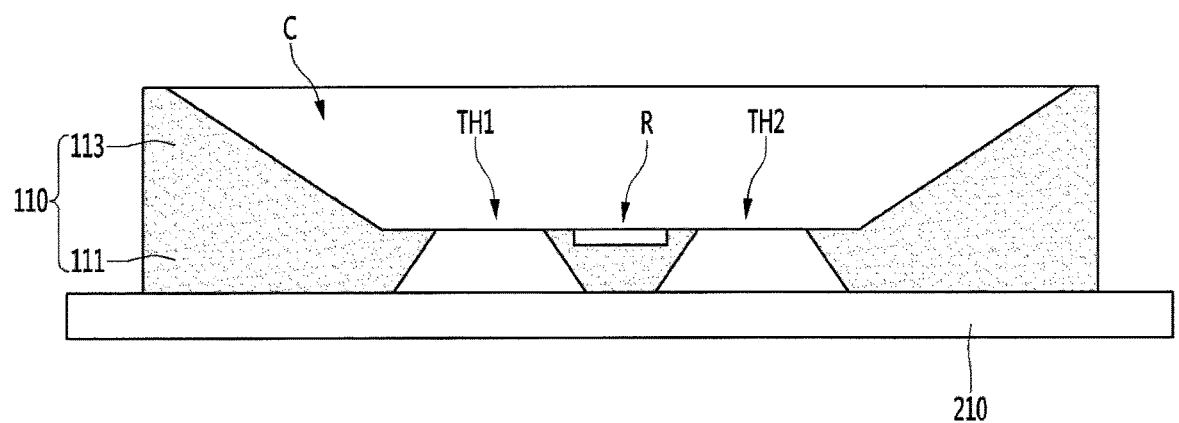
FIGS. 9 to 13 are views describing another example of a method of manufacturing a light emitting device package according to an embodiment of the present invention.

First, according to the method of manufacturing the light emitting device package according to the embodiment, as shown in FIG. 9, the body 110 may be provided on a temporary substrate 210.

FIG. 9 shows that only one body 110 is provided on the temporary substrate 210. However, according to the embodiment, one body 110 may be provided on the temporary substrate 210, and a plurality of bodies 110 may be disposed thereon. In addition, the one body 110 or the bodies 110 may be provided on the temporary substrate 210 through an injection process or the like.

According to the method of manufacturing the light emitting device package according to the embodiment of the present invention, a sort of chip scale package process may be applied.

The body 110 may include a mounting part 111 and a reflective part 113. The body 110 may include the first through hole TH1 and the second through hole TH2. In addition, the body 110 may include the recess R.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The first through hole TH1 and the second through hole TH2 may be spaced apart from each other.

The recess R may be provided in the mounting part 111. The recess R may be provided between the first through hole TH1 and the second through hole TH2. The recess R may be concavely provided in a direction from the upper surface of the mounting part 111 to the lower surface thereof.

Figure 10:
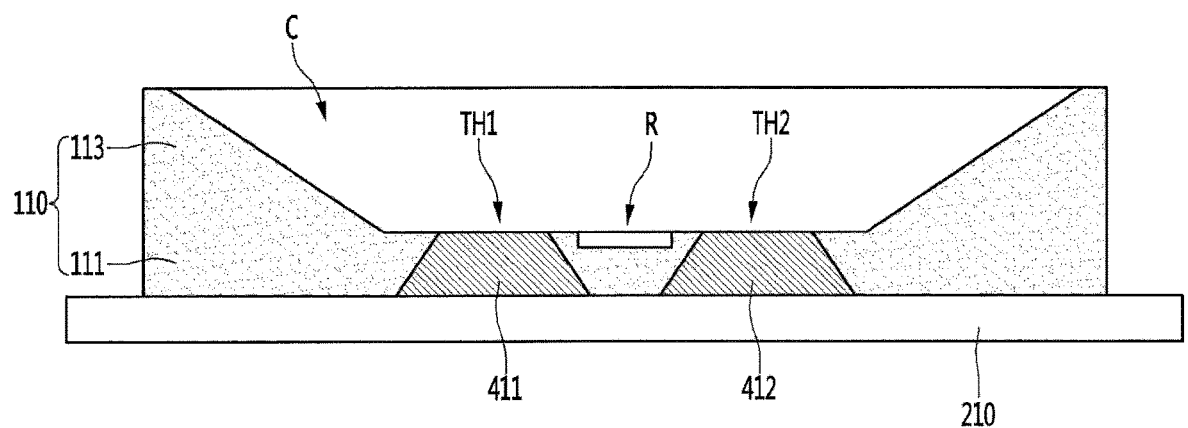

In addition, according to the method of manufacturing the light emitting device package according to the embodiment, as shown in FIG. 10, a conductive layer may be provided in the first through hole TH1 and the second through hole TH2. The first conductive layer 411 may be provided in the first through hole TH1 and the second conductive layer 412 may be provided in the second through hole TH2.

For example, the first conductive layer 411 and the second conductive layer 412 may be formed using a conductive paste. The conductive paste may be applied onto the first through hole TH1 and the second through hole TH2.

For example, the conductive paste may include one material or an alloy thereof selected from the group including Ag, Au, Pt, and the like.

Figure 11:
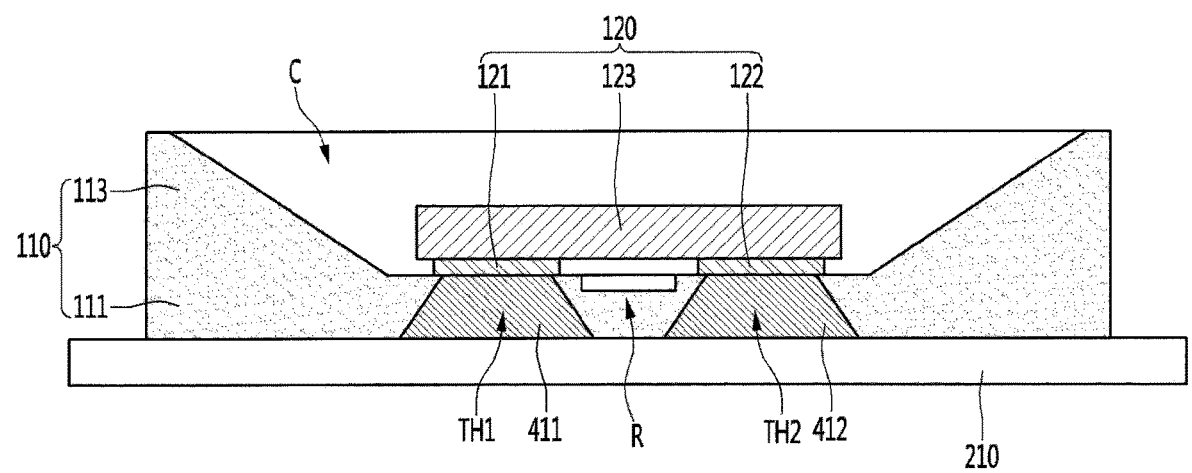

In addition, according to the method of manufacturing the light emitting device package according to the embodiment, as shown in FIG. 11, the light emitting device 120 may be provided on the mounting part 111.

According to the embodiment, the recess R may be used to function as a sort of aligning key in the process of disposing the light emitting device 120 on the mounting part 111.

The first electrode 121 of the light emitting device 120 may be disposed on the first conductive layer 411. In addition, the second electrode 122 of the light emitting device 120 may be disposed on the second conductive layer 412.

According to the embodiment, the first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

Next, according to the method of manufacturing the light emitting device package according to the embodiment, as shown in FIG. 12, the recess R may be provided with the adhesive 130.

The adhesive 130 may be provided to a region of the recess through a dotting scheme or the like. The adhesive 130 applied to the recess R may be moved to a lower region of the light emitting device 120 through a capillary phenomenon or the like.

The light emitting device 120 may be fixed to the mounting part 111 by the adhesive 130. A portion of the adhesive 130 provided in the recess R may be cured while moving in the directions of the first electrode 121 and the second electrode 122. Accordingly, the adhesive 130 may be provided in a wide region between the lower surface of the light emitting device 120 and the upper surface of the mounting part 111, so that the fixing strength between the light emitting device 120 and the mounting part 111 can be improved.

Figure 13:
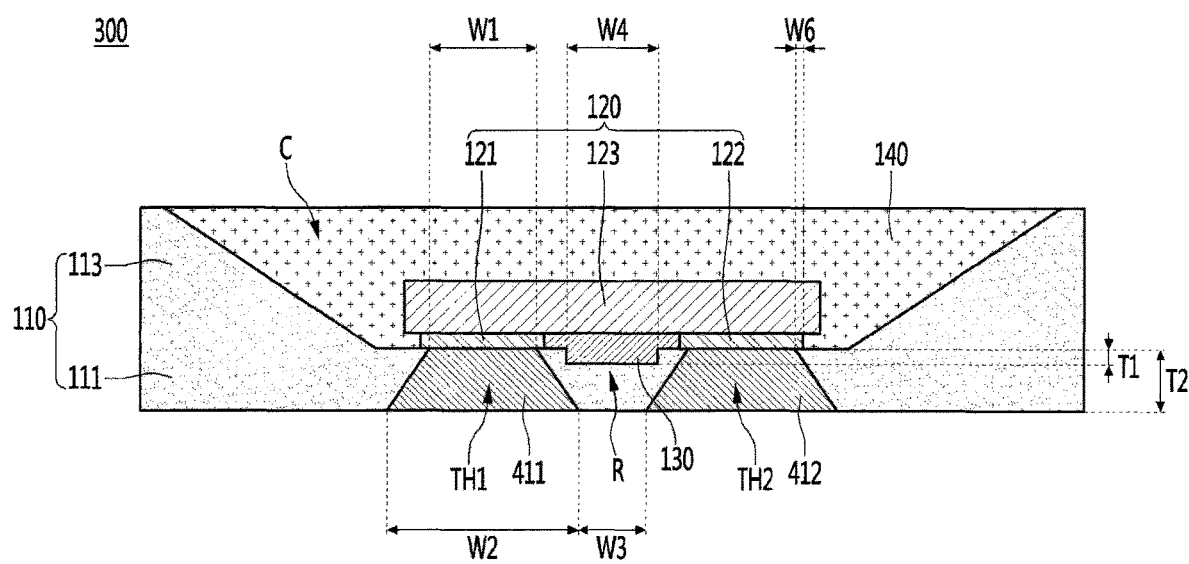

Then, as shown in FIG. 13, the molding part 140 is provided on the light emitting device 120 and the temporary substrate 210 is removed, so that the light emitting device package 300 according to the embodiment can be provided.

As described with reference to FIGS. 8 to 13, in the light emitting device package 300 according to the embodiment, the conventional lead frame is not applied when the body 110 is provided.

In the situation of the light emitting device package to which the conventional lead frame is applied, a process of forming the lead frame is further required. However, the method of manufacturing the light emitting device package according to the embodiment of the present invention does not require the process of forming the lead frame. Thus, according to the method for manufacturing a light emitting device package according to the embodiment of the present invention, a process time can be shortened and the material also can be reduced.

In addition, in the situation of the light emitting device package to which the conventional lead frame is applied, a plating process using silver or the like is additionally required to prevent deterioration of the lead frame, however, according to the method of manufacturing the light emitting device package according to the embodiment of the present invention, the lead frame is not required, thus an additional process such as silver plating can be omitted. Thus, according to the embodiments of the light emitting device package can solve the problem of discoloration of materials such as silver plating, and the manufacturing cost can be reduced by omitting the process. Therefore, according to the method of manufacturing the light emitting device package according to the embodiment of the present invention, the manufacturing cost can be reduced and the manufacturing yield and the reliability of a product can be improved.

In the light emitting device package 300 according to the embodiment, the power may be connected to the first electrode 121 through the first conductive layer 411 and the power may be connected to the second electrode 122 through the conductive layer 412.

Accordingly, the light emitting device 120 may be driven by driving power supplied through the first electrode 121 and the second electrode 122. In addition, the light emitted from the light emitting device 120 may be provided in an upper direction of the body 110.

In addition, the above described light emitting device package 300 according to the embodiment may be mounted on the sub-mount, a circuit board, or the like and supplied.

Figure 14:
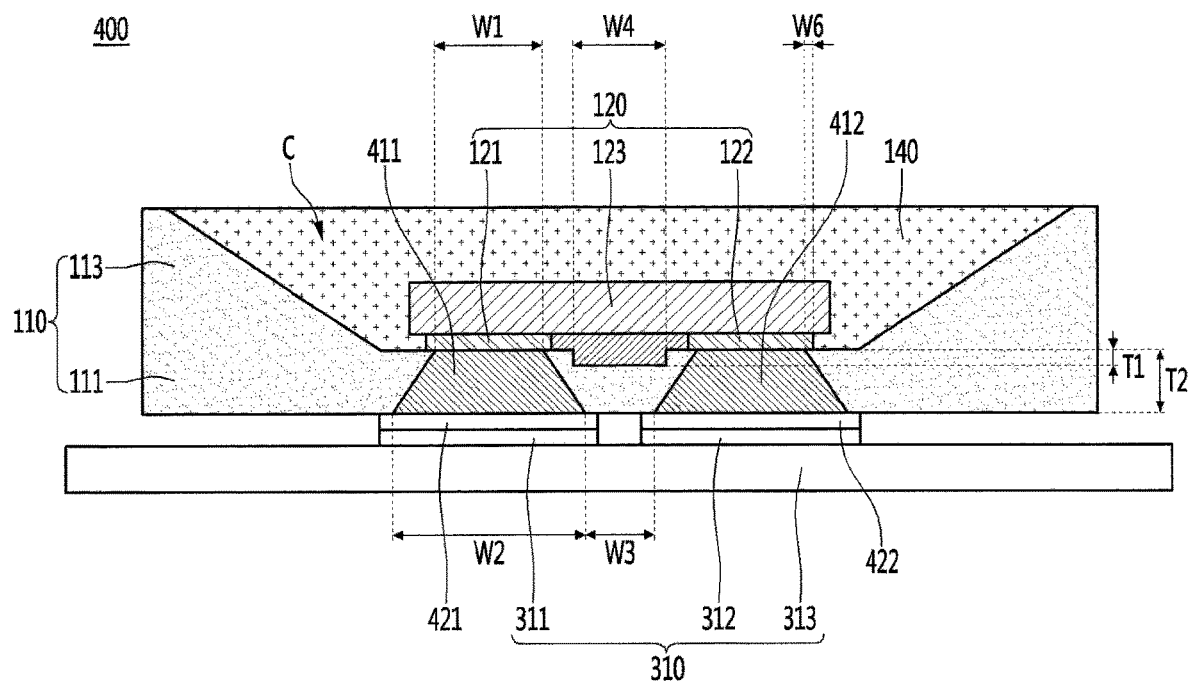
FIG. 14 is a view illustrating still another example of a light emitting device package according to an embodiment of the present invention.

Hereinafter, another example of the light emitting device package according to the embodiment of the present invention will be described with reference to FIG. 14. FIG. 14 is a view illustrating another example of a light emitting device package according to an embodiment of the present invention.

The light emitting device package according to the embodiment of the present invention shown in FIG. 14 is an example in which the light emitting device package 300 described with reference to FIGS. 8 to 13 is mounted on a circuit board 310 and supplied. Upon description of the light emitting device package according to the embodiment of the present invention with reference to FIG. 14, description overlapped with those described with reference to FIGS. 1 to 13 may be omitted.

As shown in FIG. 14, the light emitting device package 400 according to the embodiment may include the circuit board 310, the body 110, and the light emitting device 120.

The circuit board 310 may include a first pad 310, a second pad 320, and a substrate 313. The substrate 313 may be provided with a power supply circuit for controlling the driving of the light emitting device 120.

The body 110 may be disposed on the circuit board 310. The first pad 311 and the first electrode 121 may be electrically connected to each other. The second pad 312 and the second electrode 122 may be electrically connected to each other.

The first pad 311 and the second pad 312 may include a conductive material. For example, the first pad 311 and the second pad 312 may include at least one material or an alloy thereof selected from the group including Ti, Cu, Ni, Au, Cr, Ta, Pt, Sn, Ag, P, Fe, Sn, Zn, and Al. The first pad 311 and the second pad 312 may be provided as a single layer or multiple layers.

The body 110 may include a mounting part 111 and a reflective part 113.

The body 110 may include the first through hole TH1 and the second through hole TH2 provided through from the upper surface to the lower surface thereof in the first direction. The first through hole TH1 and the second through hole TH2 may be provided through the mounting part 111 in the first direction from the upper surface to the lower surface thereof.

The light emitting device 120 may include a first electrode 121, a second electrode 122, and a semiconductor layer 123.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The first through hole TH1 may be provided to overlap the first pad 311. The first electrode 121 and the first pad 311 may be provided to overlap each other in the vertical direction.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

The second through hole TH2 may be provided to overlap the second pad 312. The second electrode 122 and the second pad 312 may be provided to overlap each other in a vertical direction.

The first through hole TH1 and the second through hole TH2 may be spaced apart from each other. The first through hole TH1 and the second through hole TH2 may be spaced apart from each other under the lower surface of the light emitting device 120.

In addition, as shown in FIG. 14, the light emitting device package 400 according to the embodiment may include the first conductive layer 411 and the second conductive layer 412.

The first conductive layer 411 may be disposed in the first through hole TH1. The first conductive layer 411 may be disposed in direct contact with the lower surface of the first electrode 121. The first conductive layer 411 may be provided to overlap the first electrode 121 in the vertical direction.

The upper surface of the first conductive layer 411 may be disposed on a plane the same as the upper surface of the mounting part 111. The lower surface of the first conductive layer 411 may be provided on a plane the same as the lower surface of the mounting part 111.

The second conductive layer 412 may be disposed in the second through hole TH2. The second conductive layer 412 may be disposed in direct contact with the lower surface of the second electrode 122. The second conductive layer 412 may be provided to overlap the second electrode 122 in the vertical direction.

The upper surface of the second conductive layer 412 may be disposed on the same plane as the upper surface of the mounting part 111. The lower surface of the second conductive layer 411 may be provided on the same plane as the lower surface of the mounting part 111.

For example, the first conductive layer 411 and the second conductive layer 412 may include one material or an alloy thereof selected from the group including Ag, Au, Pt, and the like.

As shown in FIG. 14, the light emitting device package 400 according to the embodiment may include a first bonding layer 421 and a second bonding layer 422.

The first bonding layer 421 may be electrically connected to the first electrode 121 in the process of mounting the body 110 on the circuit board 310. The second bonding layer 422 may be electrically connected to the second electrode 122 in the process of mounting the body 110 on the circuit board 310.

The first bonding layer 421 and the second bonding layer 422 may be formed of at least one material or a selective alloy selected from the group including titanium (Ti), copper (Cu), nickel (Ni), gold (Au), chromium (Cr) tantalum (Ta), platinum (Pt), tin (Sn), silver (Ag), and phosphorus (P).

According to the embodiment, the first pad 311 of the circuit board 310 may be electrically connected to the first conductive layer 411 by the first bonding layer 421. In addition, the second pad 312 of the circuit board 310 may be electrically connected to the second conductive layer 412 by the second bonding layer 421.

In addition, according to the embodiment, the first conductive layer 411 and the second conductive layer 412 may be mounted on the circuit board 310 by eutectic bonding.

As shown in FIG. 14, the light emitting device package 400 according to the embodiment may include a recess R.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIG. 14, the light emitting device package 400 according to the embodiment may include an adhesive 130.

The adhesive 130 may be disposed in the recess R. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

The adhesive 130 may provide stable fixing strength between the light emitting device 120 and the mounting part 111. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material.

The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers. For example, the depth T1 of the recess R may be 50 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness of the mounting part 111. For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

In addition, as shown in FIG. 14, the light emitting device package 400 according to the embodiment may include a molding part 140.

The molding part 140 may be provided on the light emitting device 120. The molding part 140 may be disposed on the mounting part 111. The molding part 140 may be disposed in the cavity C provided in the reflective part 113.

As described with reference to FIG. 14, in the light emitting device package 400 according to the embodiment, the conventional lead frame is not applied when the body 110 is provided.

In the situation of the light emitting device package to which the conventional lead frame is applied, a process of forming the lead frame is further required. However, the light emitting device package according to the embodiment of the present invention does not require the process of forming the lead frame. Thus, according to the method for manufacturing a light emitting device package according to the embodiment of the present invention, a process time can be shortened and the material also can be reduced.

In addition, in the situation of the light emitting device package to which the conventional lead frame is applied, a plating process using silver or the like is additionally required to prevent deterioration of the lead frame, however, according to the method of manufacturing the light emitting device package according to the embodiment of the present invention, the lead frame is not required, thus an additional process such as silver plating can be omitted. Thus, according to the embodiments of the light emitting device package can solve the problem of discoloration of materials such as silver plating, and the manufacturing cost can be reduced by omitting the process. Therefore, according to the method of manufacturing the light emitting device package according to the embodiment of the present invention, the manufacturing cost can be reduced and the manufacturing yield and the reliability of a product can be improved.

Figure 15:
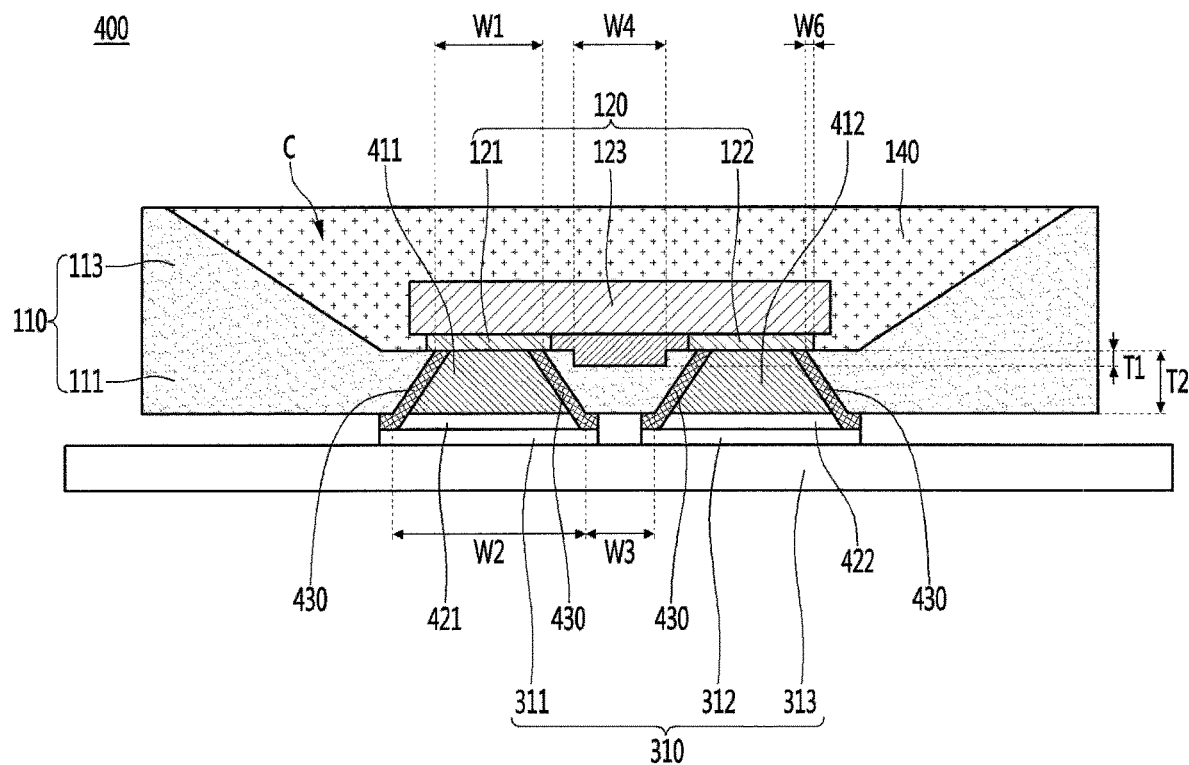
FIG. 15 is a view illustrating still another example of a light emitting device package according to an embodiment of the present invention.

In addition, FIG. 15 is a view illustrating still another example of a light emitting device package according to an embodiment of the present invention. As shown in FIG. 15, the light emitting device package according to the embodiment may further include a metal layer 430 compared to the light emitting device package described with reference to FIGS. 1 to 14.

The metal layer 430 may be provided in the first through hole TH1 and the second through hole TH2. The metal layer 430 may be provided on a side wall of the body 110 providing the first through hole TH1 and a side wall of the body 110 providing the second through hole TH2.

The metal layer 430 may be disposed between the body 110 provided therein with the first through hole TH1 and the first conductive layer 411. In addition, the metal layer 430 may be disposed between the body 110 provided therein with the second through hole TH2 and the second conductive layer 412.

In addition, according to the embodiment, the metal layer 430 may be provided on the lower surface of the body 110 adjacent to the first and second through holes TH1 and TH2.

The metal layer 430 may be formed of a material having a physical property of good adhesive strength onto the body 110. In addition, the metal layer 430 may be formed of a material having a physical property of good adhesive strength onto the first and second conductive layers 411 and 412.

Accordingly, the first and second conductive layers 411 and 412 may be stably provided in the first and second through holes TH1 and TH2. According to the embodiment, even when the adhesive strength between the first and second conductive layers 411 and 412 and the body 110 is bad, the first and second conductive layers 411 and 412 may be stably provided in the first and second through holes TH1 and TH2 by the metal layer 430.

In addition, the above light emitting device package according to the embodiment has been described based on the situation that one through hole is provided under each electrode pad.

However, according to the light emitting device package of another embodiment, through holes may be provided under each electrode pad. In addition, the through holes may have widths different from each other.

Figure 16:
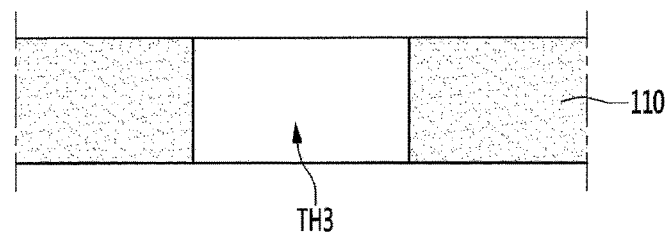
FIGS. 16 to 18 are views illustrating a modification example of a through hole applied to a light emitting device package according to an embodiment of the present invention.
Figure 17:
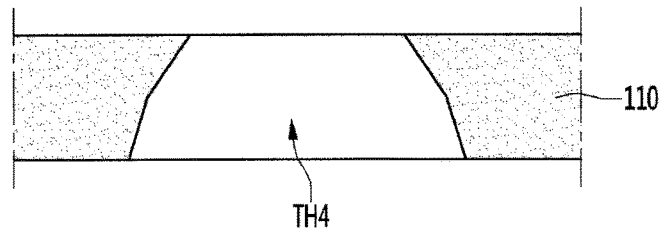
Figure 18:
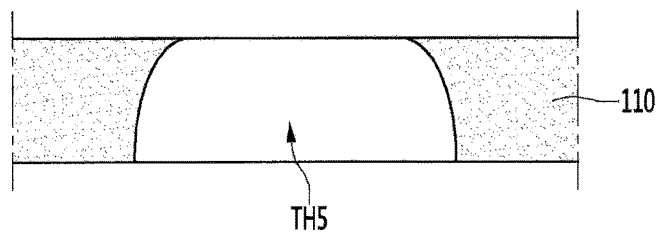

In addition, as shown in FIGS. 16 to 18, the through hole according to the embodiment may be provided in various shapes.

For example, as shown in FIG. 16, a through hole TH3 according to the embodiment may be provided with the same width from an upper region to a lower region thereof.

In addition, as shown in FIG. 17, a through hole TH4 according to the embodiment may be provided in a shape of a multi-stage structure. For example, the through hole TH4 may be provided in a shape of a two-stage structure having different inclination angles. In addition, the through hole TH4 may be provided in a shape of three stages or more having different inclination angles.

In addition, as shown in FIG. 18, a through hole TH5 may be provided in a shape in which the width changes from an upper region to a lower region thereof. For example, the through hole TH5 may be provided in a shape having a curvature from the upper region to the lower region thereof.

In addition, according to the light emitting device package of the embodiment, the body 110 may be provided to include only the mounting part 111 having a flat upper surface and exclude the reflective part 113 disposed on the mounting part 111.

Next, another example of the light emitting device package according to the embodiment of the present invention will be described with reference to FIGS. 19 and 20.

Figure 19:
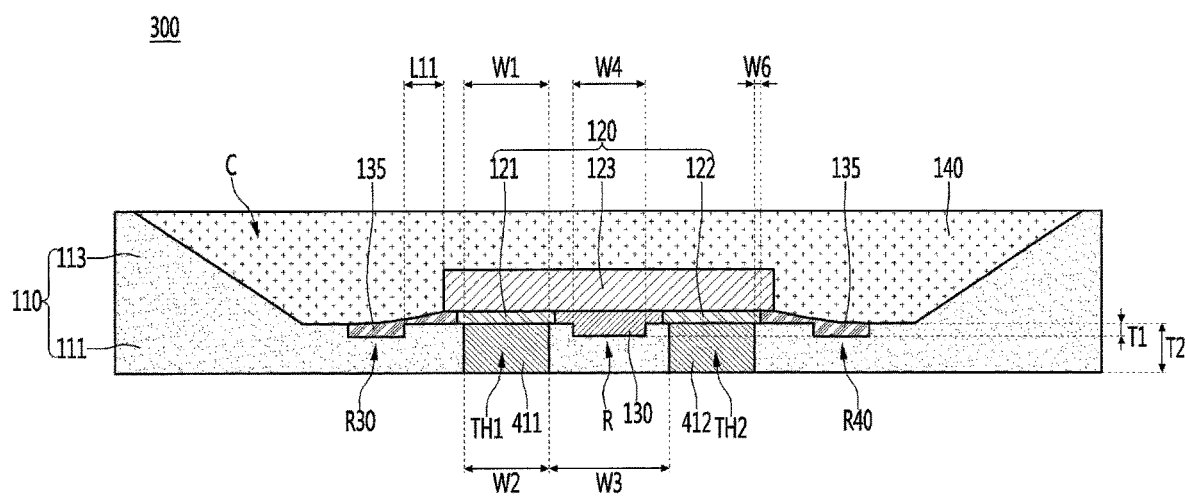
FIG. 19 is a view illustrating still another example of a light emitting device package according to an embodiment of the present invention.
Figure 20:
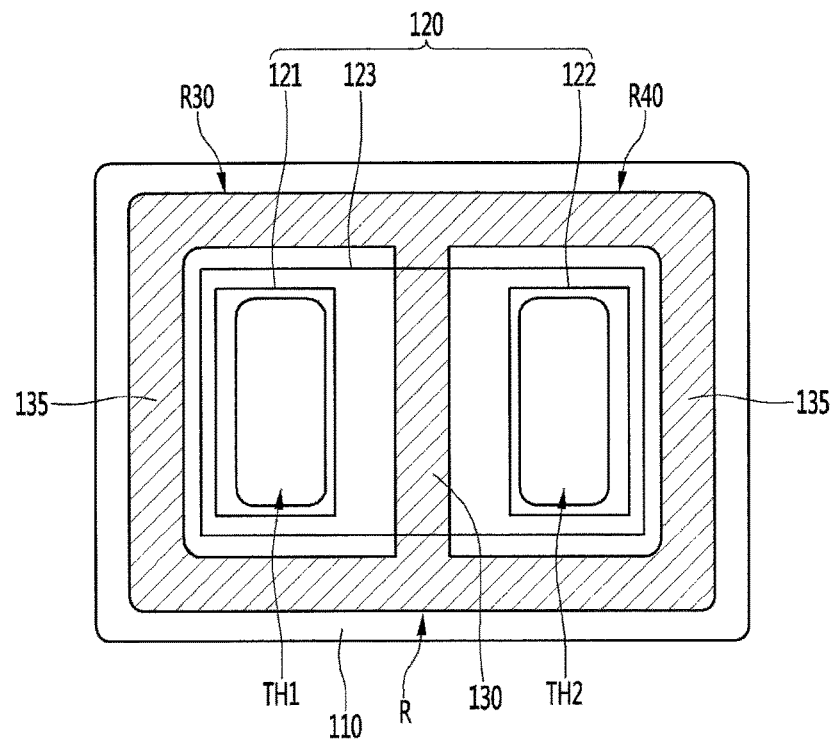
FIG. 20 is a view for describing an arrangement between through holes and recesses provided to a light emitting device package shown in FIG. 19.

FIG. 19 is a view illustrating still another example of a light emitting device package according to an embodiment of the present invention, and FIG. 20 is a view for describing an arrangement of through holes and recesses provided to a light emitting device package shown in FIG. 19.

Upon description of another example of the light emitting device package according to the embodiment with reference to FIGS. 19 and 20, description overlapped with those described with reference to FIGS. 1 to 18 may be omitted.

As shown in FIG. 19, the light emitting device package 300 according to the embodiment may include the body 110, the light emitting device 120, the first conductive layer 411, and the second conductive layer 412.

The body 110 may include a mounting part 111 and a reflective part 113. The reflective part 113 may be disposed on the mounting part 111. The reflector 113 may be disposed on a periphery of an upper surface of the mounting part 111. The reflective part 113 may provide a cavity C on the upper surface of the mounting part 111.

The body 110 may include the cavity C. The cavity may include a bottom surface and a side surface inclined to the upper surface of the body 110 from the bottom surface.

According to the embodiment, the light emitting device 120 may include a first electrode 121, a second electrode 122, and a semiconductor layer 123.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

In addition, as shown in FIG. 19, the light emitting device package 300 according to the embodiment may include a first through hole TH1 and a second through hole TH2.

For example, the first through hole TH1 and the second through hole TH2 may be provided in the body 110.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

The first through hole TH1 and the second through hole TH2 may be spaced apart from each other. The first through hole TH1 and the second through hole TH2 may be spaced apart from each other under the lower surface of the light emitting device 120.

According to the embodiment, the width W1 of an upper region of the first through hole TH1 may be less than or equal to the width of the first electrode 121. In addition, the width of an upper region of the second through hole TH2 may be less than or equal to the width of the second electrode 122.

The distance W6 from the upper region of the second through hole TH2 to a side end of the second electrode 122 may be tens of micrometers. For example, the distance W6 from the upper region of the second through hole TH2 to the side end of the second electrode 122 may be in the range of 40 micrometers to 60 micrometers. The distance W6 from the upper region of the second through hole TH2 to the side end of the second electrode 122 may be provided as 50 micrometers.

In addition, the width W1 of the upper region of the first through hole TH1 may be less than or equal to the width W2 of a lower region of the first through hole TH1. In addition, the width of the upper region of the second through hole TH2 may be less than or equal to the width of a lower region of the second through hole TH2.

For example, as shown in FIG. 19, the width W1 of the upper region of the first through hole TH1 may be equal to the width W2 of the lower region of the first through hole TH1. In addition, the width of the upper region of the second through hole TH2 may be equal to the width of the lower region of the second through hole TH2.

Figure 21:
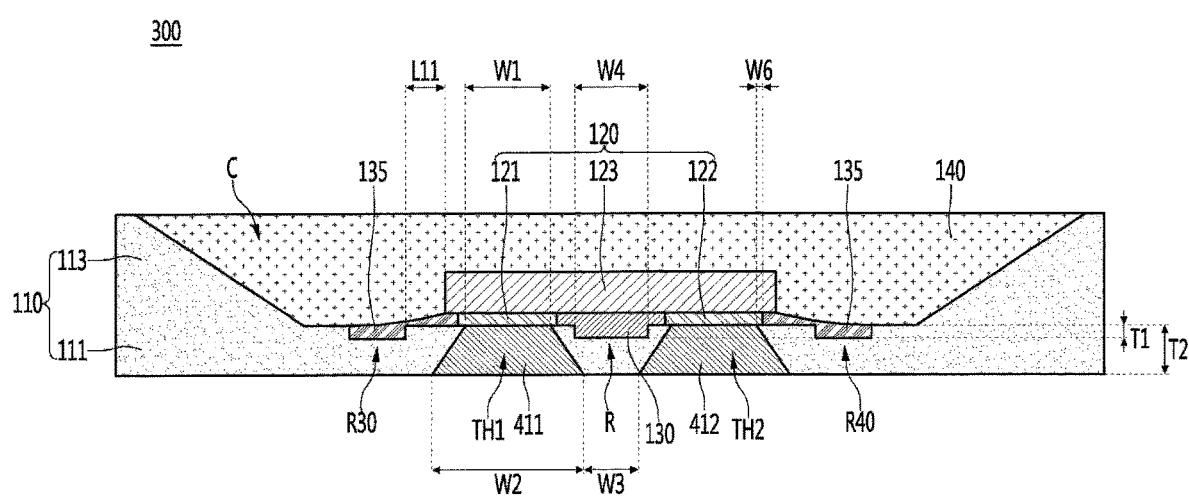
FIG. 21 is a view illustrating still another example of a light emitting device package according to an embodiment of the present invention.

In addition, according to the light emitting device package of the embodiment, as shown in FIG. 21, the first through hole TH1 and the second through hole TH2 may be provided in an inclined shape. The width of the upper region of the first through hole TH1 may be greater than the width of the lower region of the first through hole TH1. In addition, the width of the upper region of the second through hole TH2 may be greater than the width of the lower region of the second through hole TH2.

The width W3 between the first through hole TH1 and the second through hole TH2 in a lower surface region of the mounting part 111 may be hundreds of micrometers. The width W3 between the first through hole TH1 and the second through hole TH2 in the lower surface region of the mounting part 111 may be in the range of 100 micrometers to 150 micrometers.

The width W3 between the first through hole TH1 and the second through hole TH2 in the lower surface region of the mounting part 111 may be selectively spaced apart by a predetermined distance or more to prevent a short between bonding pads in the situation that the light emitting device package 100 according to the embodiment is mounted on a circuit board, a sub-mount or the like later.

As shown in FIGS. 19 and 21, the light emitting device package 300 according to the embodiment may include a recess R.

The recess R may be provided in the body 110. The recess R may be provided on the upper surface of the body 110. The recess R may be concavely provided in the direction from the upper surface of the body 110 to the lower surface thereof.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIGS. 19 and 21, the light emitting device package 300 according to the embodiment may include an adhesive 130.

The adhesive 130 may be disposed in the recess R. The adhesive 130 may be disposed between the recess R and the body 110. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

In addition, the adhesive 130 may provide a function of diffusing light emitted to the lower surface of the light emitting device 120 after the adhesive 130 is cured between the light emitting device and the mounting part 111.

The adhesive 130 may provide stable fixing strength between the light emitting device 120 and the body 110. The adhesive 130 may provide stable fixing strength between the light emitting device 120 and the mounting part 111.

For example, the adhesive 130 mayan be disposed in direct contact with the upper surface of the body 110. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material. For example, the adhesive 130 may include white silicone.

According to the embodiment, the depth T1 of the recess R may be smaller than the depth T2 of the first through hole TH1 or the depth T2 of the second through hole TH2.

The depth T1 of the recess R may be determined in consideration of the adhesive strength of the adhesive 130. In addition, the depth T1 of the recess R may be determined by considering stable strength of the mounting part 111.

The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness for maintaining the stable strength of the mounting part 111.

For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

In addition, as shown in FIGS. 19 and 21, the light emitting device package 300 according to the embodiment may include the first conductive layer 411 and the second conductive layer 412.

The first conductive layer 411 may be disposed in the first through hole TH1. The first conductive layer 411 may be disposed in direct contact with the lower surface of the first electrode 121. The first conductive layer 411 may be provided to overlap the first electrode 121 in the vertical direction.

For example, the width of the upper surface of the first conductive layer 411 may be equal to the width of the upper surface of the first through hole TH1. The width of the upper surface of the first conductive layer 411 may be equal to or smaller than the width of the first electrode 121.

The upper surface of the first conductive layer 411 may be disposed on a plane the same as the upper surface of the mounting part 111. The lower surface of the first conductive layer 411 may be provided on a plane the same as the lower surface of the mounting part 111.

The second conductive layer 412 may be disposed in the second through hole TH2. The second conductive layer 412 may be disposed in direct contact with the lower surface of the second electrode 122. The second conductive layer 412 may be provided to overlap the second electrode 122 in the vertical direction.

For example, the width of the upper surface of the second conductive layer 412 may be equal to the width of the upper surface of the second through hole TH2. The width of the upper surface of the second conductive layer 412 may be equal to or smaller than the width of the second electrode 122.

The upper surface of the second conductive layer 412 may be disposed on the same plane as the upper surface of the mounting part 111. The lower surface of the second conductive layer 411 may be provided on the same plane as the lower surface of the mounting part 111.

The first conductive layer 411 and the second conductive layer 412 may be disposed in the first through hole TH1 and the second through hole TH2, respectively, and electrically connected to the circuit board mounted thereon with the light emitting device package 300.

For example, the first conductive layer 411 and the second conductive layer 412 may include one material or an alloy thereof selected from the group including Ag, Au, Pt, and the like. However, the embodiment is not limited thereto, and a material capable of ensuring a conductive function may be used.

As shown in FIGS. 19 to 21, the light emitting device package according to the embodiment may include a first upper recess R30 and a second upper recess R40.

The first upper recess R30 may be provided on the upper surface of the body 110. The first upper recess R30 may be concavely provided from the upper surface of the body 110 to the lower surface thereof. The first upper recess R30 may be spaced apart from the first through hole TH1.

As shown in FIG. 20, the first upper recess R30 may be provided adjacent to three sides of the first electrode 121 when viewed from the top. For example, the first upper recess R3 may be provided at a periphery of the first electrode 121 in the shape of a bracket ("[").

The second upper recess R40 may be provided on the upper surface of the body 110. The second upper recess R40 may be concavely provided from the upper surface of the body 110 to the lower surface thereof. The second upper recess R40 may be spaced apart from the second through hole TH2.

As shown in FIG. 20, the second upper recess R40 may be provided adjacent to three sides of the second electrode 122 when viewed from the top. For example, the second upper recess R40 may be provided at a periphery of the second electrode 122 in the shape of a bracket ("]").

According to the embodiment, the first upper recess R30 and the second upper recess R40 may be provided in connection with the recess R. For example, the first upper recess R30 and the recess R may be provided in the form of a closed loop around the first electrode 121. For example, the second upper recess R40 and the recess R may be provided in the form of a closed loop around the second electrode 122.

For example, the first upper recess R30 and the second upper recess R40 may be provided in a width of tens of micrometers to hundreds of micrometers.

In addition, according to another embodiment, the first upper recess R30 and the second upper recess R40 may be spaced apart from each other. The first upper recess R30 and the recess R may be spaced apart from each other. The second upper recess R40 and the recess R may be spaced apart from each other.

As shown in FIGS. 19 to 21, the light emitting device package according to the embodiment may include a resin part 135.

The resin part 135 may be provided in the first upper recess R30 and the second upper recess R40.

The resin part 135 may be disposed on the side surface of the first electrode 121. The resin part 135 may be provided in the first upper recess R30 and extend to a region where the first electrode 121 is disposed. The resin part 135 may be disposed under the semiconductor layer 123.

The distance L11 from an end of the first upper recess R30 to an adjacent end of the light emitting device 120 may be hundreds of micrometers or less. For example, the distance L11 from the end of the first upper recess R30 to the adjacent end of the light emitting device 120 may be equal to or less than 200 micrometers.

The distance L11 from the end of the first upper recess R30 to the adjacent end of the light emitting device 120 may be determined by viscosity or the like of the resin part 135 filled in the first upper recess R30.

The distance L11 from the end of the first upper recess R30 to the adjacent end of the light emitting device 120 may be selected as a distance in which the resin part 135 applied to the first upper recess R30 is provided to extend to a region where the first electrode 121 is disposed.

In addition, the resin part 135 may be disposed on the side surface of the second electrode 122. The resin part 135 may be provided in the second upper recess R40 and extend to a region where the second electrode 122 is disposed. The resin part 135 may be disposed under the semiconductor layer 123.

In addition, the resin part 135 may be provided on the side surface of the semiconductor layer 123. The resin part 135 is disposed on the side surface of the semiconductor layer 123, so that the first and second conductive layers 411 and 412 can be effectively prevented from moving to the side surface of the semiconductor layer 123. In addition, when disposed on the side surface of the semiconductor layer 123, the resin part 135 may be disposed under an active layer of the semiconductor layer 123, so that the light extraction efficiency of the light emitting device 120 can be improved.

The first upper recess R30 and the second upper recess R40 may provide a sufficient space for providing the resin portion 135.

For example, the resin part 135 may include at least one of an epoxy-based material, a silicone-based material, a hybrid material including the epoxy-based material and the silicon-based material. In addition, the resin part 135 may include a reflective material such as white silicone including $TiO_2$ and/or silicone.

The resin part 135 may be disposed under the light emitting device 120 to perform a sealing function. In addition, the resin part 135 may improve the adhesive strength between the light emitting device 120 and the body 110.

The resin part 135 may seal a periphery of the first electrode 121 and the second electrode 122. The resin part 135 may prevent the first conductive layer 411 and the second conductive layer 412 from being diffused and moved in a direction to the light emitting device 120 from regions of the first through hole TH1 and the second through hole TH2.

In addition, when the resin part 135 includes a material having a reflection characteristic such as white silicon, the resin part 135 reflects light provided from the light emitting element 120 toward the upper part of the body 110, so that the light extraction efficiency of the light emitting device package 300 can be improved.

In addition, as shown in FIGS. 19 and 21, the light emitting device package 300 according to the embodiment may include the molding part 140.

The molding part 140 may be provided on the light emitting device 120. The molding part 140 may be disposed on the body 110. The molding part 140 may be disposed on the mounting part 111. The molding part 140 may be disposed in the cavity C provided in the reflective part 113. The molding part 140 may be disposed in the cavity C provided in the package body 110. The molding part 140 may be disposed on the resin part 135.

Next, another example of the light emitting device package according to the embodiment of the present invention will be described with reference to FIG. 22.

Upon description of the light emitting device package according to the embodiment of the present invention with reference to FIG. 22, description overlapped with those described with reference to FIGS. 1 to 21 may be omitted.

The light emitting device package shown in FIG. 22 differs from the light emitting device package described with reference to FIGS. 18 to 21 in positions of forming the first upper recess R30 and the second upper recess R40.

Figure 22:
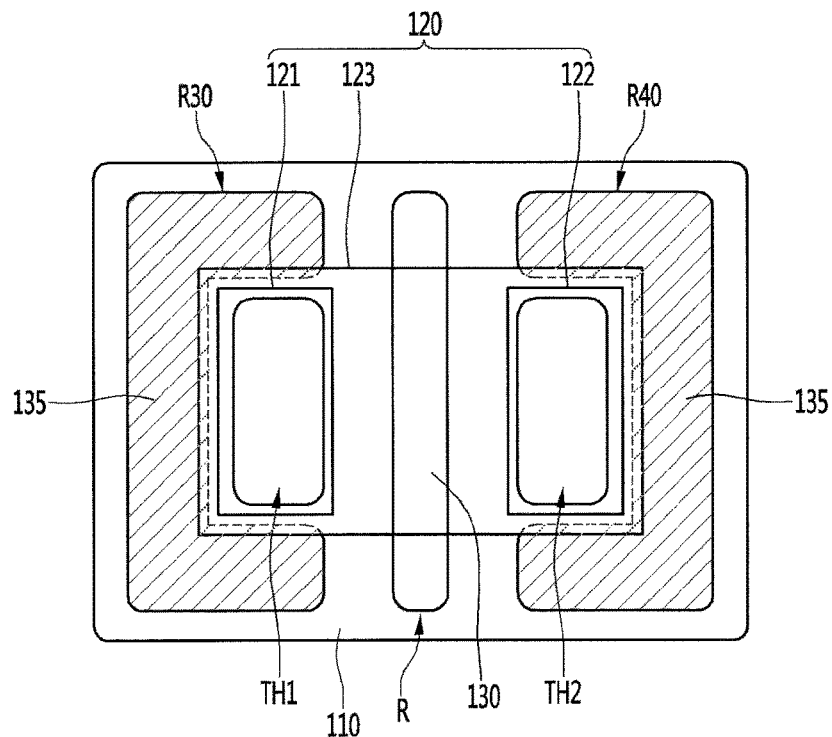
FIG. 22 is a view illustrating still another example of a light emitting device package according to an embodiment of the present invention.

As shown in FIG. 22, in the light emitting device package when viewed from the top, a partial region of the first upper recess R30 may be provided to overlap the semiconductor layer 123 in the vertical direction. For example, a side region of the first upper recess R30 adjacent to the first electrode 121 may extend under the semiconductor layer 123.

As shown in FIG. 22, in the light emitting device package when viewed from the top, a partial region of the second upper recess R40 may be provided to overlap the semiconductor layer 123 in the vertical direction. For example, a side region of the second upper recess R40 adjacent to the first electrode 121 may extend under the semiconductor layer 123.

Accordingly, the resin part 135 filled in the first upper recess R30 and the second upper recess R40 may effectively seal peripheries of the first electrode 121 and the second electrode 122.

In addition, the first upper recess R30 and the second upper recess R40 may provide sufficient space under the light emitting device 120 to provide the resin part 135. The first upper recess R30 and the second upper recess R40 may provide a suitable space under the light emitting device 120 to perform a sort of underfill process.

For example, the resin part 135 may include at least one of an epoxy-based material, a silicone-based material, a hybrid material including the epoxy-based material and the silicon-based material. For example, the resin part 135 may be a reflective part that reflects the light emitted from the light emitting device 120, and may be resin including a reflective material such as $TiO_2$. The resin part 135 may include white silicone.

The resin part 135 may be disposed under the light emitting device 120 to perform a sealing function. In addition, the resin part 135 may improve the adhesive strength between the light emitting device 120 and the body 110.

The resin part 135 may seal a periphery of the first electrode 121 and the second electrode 122. The resin part 135 may prevent the first conductive layer 411 and the second conductive layer 412 from diffuse and move in the direction to the light emitting device 120 from regions of the first opening TH1 and the second opening TH2.

In addition, when the resin part 135 includes a material having a reflection characteristic such as the white silicon, the resin part 135 reflects the light provided from the light emitting element 120 toward the upper part of the package body 110, so that the light extraction efficiency of the light emitting device package 100 can be improved.

In the light emitting device package 300 according to the embodiment, the power may be connected to the first electrode 121 through the first opening TH1 and the power may be connected to the second electrode 122 through the second opening TH2.

Accordingly, the light emitting device 120 may be driven by driving power supplied through the first electrode 121 and the second electrode 122. In addition, the light emitted from the light emitting device 120 may be provided in an upper direction of the body 110.

Next, another example of the light emitting device package according to the embodiment of the present invention will be described with reference to FIG. 23.

Upon description of another example of the light emitting device package according to the embodiment with reference to FIG. 23, description overlapped with those described with reference to FIGS. 1 to 22 may be omitted.

Figure 23:
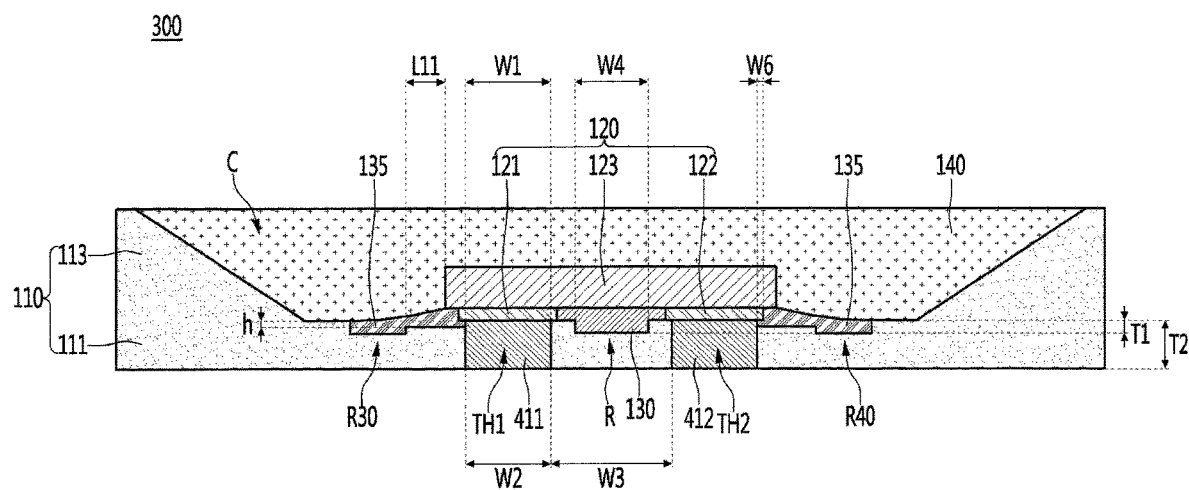
FIG. 23 is a view illustrating still another example of a light emitting device package according to an embodiment of the present invention.

As shown in FIG. 23, the light emitting device package 300 according to the embodiment may include the body 110, the light emitting device 120, the first conductive layer 411, and the second conductive layer 412.

The body 110 may include a mounting part 111 and a reflective part 113. The reflective part 113 may be disposed on the mounting part 111. The reflector 113 may be disposed on a periphery of an upper surface of the mounting part 111. The reflective part 113 may provide a cavity C on the upper surface of the mounting part 111.

The body 110 may include the cavity C. The cavity may include a bottom surface and a side surface inclined to the upper surface of the body 110 from the bottom surface.

According to the embodiment, the light emitting device 120 may include a first electrode 121, a second electrode 122, and a semiconductor layer 123.

The light emitting device 120 may be disposed on the body 110. The light emitting device 120 may be disposed on the mounting part 111. The light emitting device 120 may be disposed in the cavity C provided by the reflective part 113.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed between the semiconductor layer 123 and the mounting part 111. The second electrode 122 may be disposed between the semiconductor layer 123 and the mounting part 111.

In addition, as shown in FIG. 23, the light emitting device package 300 according to the embodiment may include a first through hole TH1 and a second through hole TH2.

For example, the first through hole TH1 and the second through hole TH2 may be provided in the body 110.

The first through hole TH1 may be provided in the mounting part 111. The first through hole TH1 may be provided while passing through the mounting part 111. The first through hole TH1 may be provided while passing through the upper surface and the lower surface of the mounting part 111 in the first direction.

The first through hole TH1 may be disposed under the first electrode 121 of the light emitting device 120. The first through hole TH1 may be provided to overlap the first electrode 121 of the light emitting device 120. The first through hole TH1 may be provided to overlap the first electrode 121 of the light emitting device 120 in the first direction directed from the upper surface toward the lower surface of the mounting part 111.

The second through hole TH2 may be provided in the mounting part 111. The second through hole TH2 may be provided while passing through the mounting part 111. The second through hole TH2 may be provided while passing through the upper surface and the lower surface of the mounting part 111 in the first direction.

The second through hole TH2 may be arranged under the second electrode 122 of the light emitting device 120. The second through hole TH2 may be provided to overlap the second electrode 122 of the light emitting device 120. The second through hole TH2 may be provided to overlap the second electrode 122 of the light emitting device 120 in the first direction directed from the upper surface toward the lower surface of the mounting part 111.

The first through hole TH1 and the second through hole TH2 may be spaced apart from each other. The first through hole TH1 and the second through hole TH2 may be spaced apart from each other under the lower surface of the light emitting device 120.

According to the embodiment, the width W1 of an upper region of the first through hole TH1 may be less than or equal to the width of the first electrode 121. In addition, the width of an upper region of the second through hole TH2 may be less than or equal to the width of the second electrode 122.

The distance W6 from the upper region of the second through hole TH2 to a side end of the second electrode 122 may be tens of micrometers. For example, the distance W6 from the upper region of the second through hole TH2 to the side end of the second electrode 122 may be in the range of 40 micrometers to 60 micrometers. The distance W6 from the upper region of the second through hole TH2 to the side end of the second electrode 122 may be provided as 50 micrometers.

In addition, the width W1 of the upper region of the first through hole TH1 may be less than or equal to the width W2 of a lower region of the first through hole TH1. In addition, the width of the upper region of the second through hole TH2 may be less than or equal to the width of a lower region of the second through hole TH2.

The width W3 between the first through hole TH1 and the second through hole TH2 in a lower surface region of the mounting part 111 may be hundreds of micrometers. The width W3 between the first through hole T111 and the second through hole TH2 in the lower surface region of the mounting part 111 may be in the range of 100 micrometers to 150 micrometers.

The width W3 between the first through hole TH1 and the second through hole TH2 in the lower surface region of the mounting part 111 may be selectively spaced apart by a predetermined distance or more to prevent a short between bonding pads in the situation that the light emitting device package 100 according to the embodiment is mounted on a circuit board, a sub-mount or the like later.

As shown in FIG. 23, the light emitting device package 300 according to the embodiment may include a recess R.

The recess R may be provided in the body 110. The recess R may be provided on the upper surface of the body 110. The recess R may be concavely provided in the direction from the upper surface of the body 110 to the lower surface thereof.

The recess R may be provided in the mounting part 111. The recess R may be provided between the first through hole TH1 and the second through hole TH2. The recess R may be concavely provided in a direction from the upper surface of the mounting part 111 to the lower surface thereof. The recess R may be arranged under the light emitting device 120.

As shown in FIG. 23, the light emitting device package 300 according to the embodiment may include an adhesive 130.

The adhesive 130 may be disposed in the recess R. The adhesive 130 may be disposed between the recess R and the body 110. The adhesive 130 may be disposed between the light emitting device 120 and the mounting part 111. The adhesive 130 may be disposed between the first electrode 121 and the second electrode 122. For example, the adhesive 130 may be disposed in contact with a side surface of the first electrode 121 and a side surface of the second electrode 122.

In addition, the adhesive 130 may provide a function of diffusing light emitted to the lower surface of the light emitting device 120 after the adhesive 130 is cured between the light emitting device and the mounting part 111.

The adhesive 130 may provide stable fixing strength between the light emitting device 120 and the body 110. The adhesive 130 may provide stable fixing strength between the light emitting device 120 and the mounting part 111.

For example, the adhesive 130 may be disposed in direct contact with the upper surface of the body 110. For example, the adhesive 130 may be disposed in direct contact with the upper surface of the mounting part 111. In addition, the adhesive 130 may be disposed in direct contact with the lower surface of the light emitting device 120.

For example, the adhesive 130 may include at least one of an epoxy-based material, a silicone-based material, a hybrid material including the epoxy-based material and the silicon-based material. For example, the adhesive 130 may include white silicone.

According to the embodiment, the depth T1 of the recess R may be smaller than the depth T2 of the first through hole TH1 or the depth T2 of the second through hole TH2.

The depth T1 of the recess R may be determined in consideration of the adhesive strength of the adhesive 130. In addition, the depth T1 of the recess R may be determined by considering stable strength of the mounting part 111.

The recess R may be provided at a first depth or more so that the adhesive 130 is sufficiently provided between the lower surface of the light emitting device 120 and the upper surface of the mounting part 111. In addition, the recess R may be provided at a second depth or less to provide the stable strength of the mounting part 111.

The depth T1 and the width W4 of the recess R may exert influence on a forming position and the fixing strength of the adhesive 130. The depth T1 and the width W4 of the recess R may be determined to provide sufficient fixing strength by the adhesive 130 disposed between the mounting part 111 and the light emitting device 120.

For example, the depth T1 of the recess R may be tens of micrometers. The depth T1 of the recess R may be in the range of 40 micrometers to 60 micrometers.

In addition, the width W4 of the recess R may be hundreds of micrometers. The width W4 of the recess R may be narrower than a gap between the first electrode 121 and the second electrode 122. The width W4 of the recess R may be provided in the range of 140 micrometers to 160 micrometers. For example, the width W4 of the recess R may be 150 micrometers.

The depth T2 of the first through hole TH1 may correspond to the thickness of the mounting part 111. The depth T2 of the first through hole TH1 may be provided in a thickness for maintaining the stable strength of the mounting part 111.

For example, the depth T2 of the first through hole TH1 may be hundreds of micrometers. The depth T2 of the first through hole TH1 may be provided in the range of 180 micrometers to 220 micrometers. For example, the depth T2 of the first through hole TH1 may be 200 micrometers.

In addition, as shown in FIG. 23, the light emitting device package 300 according to the embodiment may include the first conductive layer 411 and the second conductive layer 412.

The first conductive layer 411 may be disposed in the first through hole THE. The first conductive layer 411 may be disposed in direct contact with the lower surface of the first electrode 121. The first conductive layer 411 may be provided to overlap the first electrode 121 in the vertical direction.

For example, the width of the upper surface of the first conductive layer 411 may be equal to the width of the upper surface of the first through hole TH1. The width of the upper surface of the first conductive layer 411 may be equal to or smaller than the width of the first electrode 121.

The upper surface of the first conductive layer 411 may be disposed on a plane the same as the upper surface of the mounting part 111. The lower surface of the first conductive layer 411 may be provided on a plane the same as the lower surface of the mounting part 111.

The second conductive layer 412 may be disposed in the second through hole TH2. The second conductive layer 412 may be disposed in direct contact with the lower surface of the second electrode 122. The second conductive layer 412 may be provided to overlap the second electrode 122 in the vertical direction.

For example, the width of the upper surface of the second conductive layer 412 may be equal to the width of the upper surface of the second through hole TH2. The width of the upper surface of the second conductive layer 412 may be equal to or smaller than the width of the second electrode 122.

The upper surface of the second conductive layer 412 may be disposed on the same plane as the upper surface of the mounting part 111. The lower surface of the second conductive layer 411 may be provided on the same plane as the lower surface of the mounting part 111.

The first conductive layer 411 and the second conductive layer 412 may be disposed in the first through hole TH1 and the second through hole TH2, respectively, and electrically connected to the circuit board mounted thereon with the light emitting device package 300.

For example, the first conductive layer 411 and the second conductive layer 412 may include one material or an alloy thereof selected from the group including Ag, Au, Pt, and the like. However, the embodiment is not limited thereto, and a material capable of ensuring a conductive function may be used.

As shown in FIG. 23, the light emitting device package according to the embodiment may include a first upper recess R30 and a second upper recess R40.

The first upper recess R30 may be provided on the upper surface of the body 110. The first upper recess R30 may be concavely provided from the upper surface of the body 110 to the lower surface thereof. The first upper recess R30 may be spaced apart from the first through hole TH1.

In addition, according to the embodiment, the bottom surfaces of the first upper recess R30 may be provided in a stepped structure having different heights. The upper region of the first upper recess R30 and the upper region of the first through hole TH1 may be connected to each other. The upper region of the first upper recess R30 and the upper region of the first through hole TH1 may be connected to each other under the first electrode 121.

The second upper recess R40 may be provided on the upper surface of the body 110. The second upper recess R40 may be concavely provided from the upper surface of the body 110 to the lower surface thereof. The second upper recess R40 may be spaced apart from the second through hole TH2.

In addition, according to the embodiment, the bottom surfaces of the second upper recess R20 may be provided in a stepped structure having different heights. The upper region of the second upper recess R40 and the upper region of the second through hole TH2 may be connected to each other. The upper region of the second upper recess R40 and the upper region of the second through hole TH2 may be connected to each other under the second electrode 122.

As shown in FIG. 23, the light emitting device package according to the embodiment may include a resin part 135.

The resin part 135 may be provided in the first upper recess R30 and the second upper recess R40.

The resin part 135 may be disposed on the side surface of the first electrode 121. The resin part 135 may be provided in the first upper recess R30 and extend to a region where the first electrode 121 is disposed. The resin part 135 may be disposed under the semiconductor layer 123.

The end of the first upper recess R30 adjacent to the first through hole TH1 may be spaced apart from the lower surface of the first electrode 121 by a distance "h". The distance "h" may be determined by the viscosity of the resin part 135 filled in the first upper recess R30. The distance "h" may be provided as a distance to prevent the resin part 135 provided in the first upper recess R30 from flowing into the first through hole TH1 and enable the resin part to be disposed between the first upper recess R30 and the first electrode 121. For example, the distance "h" may be in the range of several micrometers to tens of micrometers.

In addition, the resin part 135 may be disposed on the side surface of the second electrode 122. The resin part 135 may be provided in the second upper recess R40 and extend to a region where the second electrode 122 is disposed. The resin part 135 may be disposed under the semiconductor layer 123.

An end of the second upper recess R40 adjacent to the second through hole TH1 may be spaced apart from the lower surface of the second electrode 122 by the distance "h". The distance "h" may be determined by the viscosity or the like of the resin part 135 filled in the second upper recess R40. The distance "h" may be provided as a distance to prevent the resin part 135 provided in the second upper recess R40 from flowing into the second through hole TH2 and enable the resin part to be disposed between the second upper recess R40 and the second electrode 122. For example, the distance "h" may be in the range of several micrometers to tens of micrometers.

In addition, the resin part 135 may be provided on the side surface of the semiconductor layer 123. The resin part 135 is disposed on the side surface of the semiconductor layer 123, so that the first and second conductive layers 411 and 412 can be effectively prevented from moving to the side surface of the semiconductor layer 123. In addition, when disposed on the side surface of the semiconductor layer 123, the resin part 135 may be disposed under an active layer of the semiconductor layer 123, so that the light extraction efficiency of the light emitting device 120 can be improved.

The first upper recess R30 and the second upper recess R40 may provide a sufficient space for providing the resin portion 135.

For example, the resin part 135 may include at least one of an epoxy-based material, a silicone-based material, a hybrid material including the epoxy-based material and the silicon-based material. In addition, the resin part 135 may include a reflective material such as white silicone including $TiO_2$ and/or silicone.

The resin part 135 may be disposed under the light emitting device 120 to perform a sealing function. In addition, the resin part 135 may improve the adhesive strength between the light emitting device 120 and the body 110.

The resin part 135 may seal a periphery of the first electrode 121 and the second electrode 122. The resin part 135 may prevent the first conductive layer 411 and the second conductive layer 412 from being diffused and moved in a direction to the light emitting device 120 from regions of the first through hole TH1 and the second through hole TH2.

In addition, when the resin part 135 includes a material having a reflection characteristic such as white silicon, the resin part 135 reflects light provided from the light emitting element 120 toward the upper part of the body 110, so that the light extraction efficiency of the light emitting device package 300 can be improved.

In addition, as shown in FIG. 23, the light emitting device package 300 according to the embodiment may include the molding part 140.

The molding part 140 may be provided on the light emitting device 120. The molding part 140 may be disposed on the body 110. The molding part 140 may be disposed on the mounting part 111. The molding part 140 may be disposed in the cavity C provided in the reflective part 113. The molding part 140 may be disposed in the cavity C provided in the package body 110. The molding part 140 may be disposed on the resin part 135.

In addition, the light emitting device package according to the embodiment described above may include various modification examples.

First, modification examples of the body applied to the light emitting device package according to the embodiment will be described with reference to FIGS. 24 to 29. Upon description of the light emitting device package according to the embodiment of the present invention with reference to FIGS. 14 to 29, description overlapped with those described with reference to FIGS. 1 to 23 may be omitted.

Figure 24:
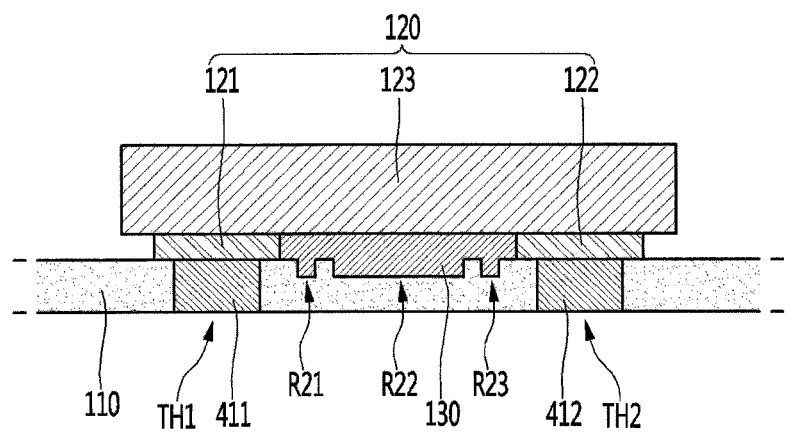
FIGS. 24 to 26 are views describing a modification example of a body applied to a light emitting device package according to an embodiment of the present invention.
Figure 25:
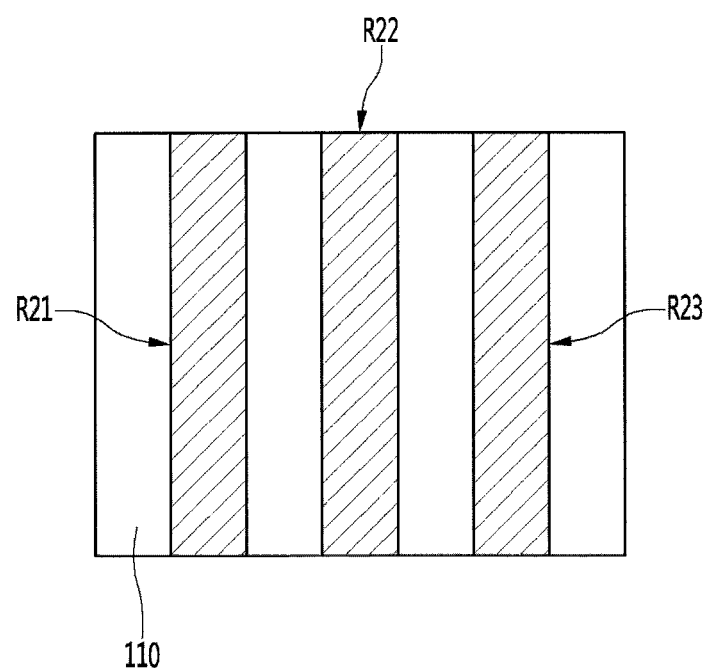
Figure 26:
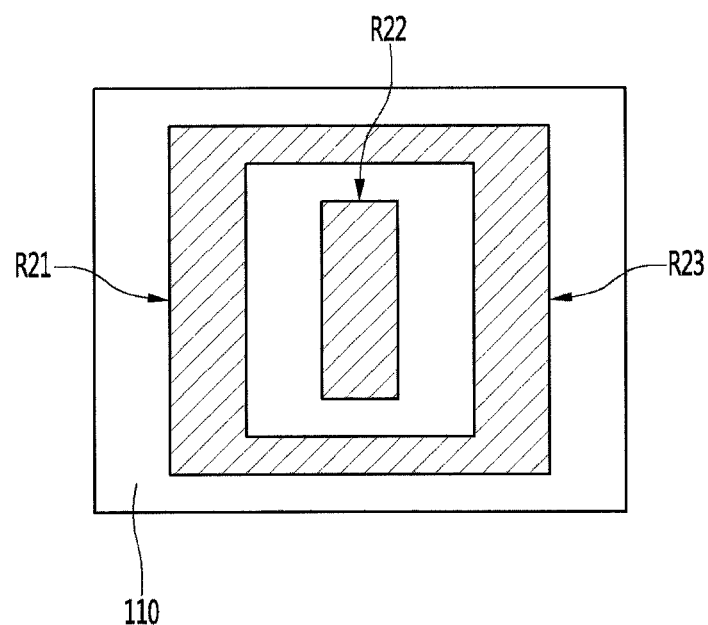

FIGS. 24 to 26 are views describing a modification example of a body applied to a light emitting device package according to an embodiment of the present invention.

According to the light emitting device package 300 of the embodiment, as shown in FIG. 24, the body 110 may include at least three recesses provided on the upper surface thereof.

For example, the body 110 may include a first upper recess R21 arranged toward the first through hole TH1 about a central region of the upper surface of the body. The first upper recess R21 may be concavely provided from the upper surface of the body 110 in a direction to the lower surface thereof.

In addition, the body 110 may include a third upper recess R23 arranged toward the second through hole TH2 about the central region of the upper surface of the body. The third upper recess R23 may be concavely provided from the upper surface of the body 110 in the direction to the lower surface thereof.

In addition, the body 110 may include a second upper recess R22 arranged in the central region of the upper surface thereof. The second upper recess R22 may be concavely provided from the upper surface of the body 110 in the direction to the lower surface thereof. The second upper recess R22 may be arranged between the first upper recess R21 and the third upper recess R23.

According to the light emitting device package 300 of the embodiments, a first adhesive 130 may be provided in the first upper recess R21, the second upper recess R22, and the third upper recess R23. The first adhesive 130 may be disposed between the light emitting device 120 and the body 110. The first adhesive 130 may be disposed between the first electrode 121 and the second electrode 122. For example, the first adhesive 130 may be disposed in contact with the side surface of the first electrode 121 and the side surface of the second electrode 122.

The first upper recess R21, the second upper recess R22, and the third upper recess R23 may provide a suitable space under the light emitting device 120 to perform a sort of underfill process to attach the light emitting device 120 to the package body.

The first upper recess R21, the second upper recess R22, and the third upper recess R23 may be provided at a first depth or more so that the first adhesive 130 is sufficiently provided between the lower surface of the light emitting device 120 and the upper surface of the body 110. In addition, the first upper recess R21, the second upper recess R22, and the third upper recess R23 may be provided at a second depth or less to provide stable strength of the body 110.

The adhesive 130 may provide stable fixing strength between the light emitting device 120 and the body 110. For example, the first adhesive 130 may be disposed in direct contact with the upper surface of the body 110. In addition, the adhesive 130 may be disposed in direct contact with the lower surface of the light emitting device 120.

In addition, the first upper recess R21 and the first adhesive 130 may prevent the first conductive layer 411 provided in the first through hole TH1 from moving to the lower region of the light emitting device 120. In addition, the third upper recess R23 and the first adhesive 130 may prevent the second conductive layer 412 provided in the second through hole TH2 from moving to the lower region of the light emitting device 120. Accordingly, the light emitting device 120 may be prevented from electrical short or deterioration caused by the movement of the first and second conductive layers 411 and 412.

In addition, FIG. 24 is a sectional view of the body 110 applied to the light emitting device package according to the embodiment, and FIGS. 25 and 26 are plan views of the body 110 shown in FIG. 24.

For example, as shown in FIG. 25, the first upper recess R21, the second upper recess R22, and the third upper recess R23 may be spaced apart from and parallel to each other on the upper surface of the body 110 in one direction. The first upper recess R21, the upper second recess R22 and the third upper recess R23 may extend on the upper surface of the body 110 in one direction.

In addition, as shown in FIG. 26, the first upper recess R21 and the third upper recess R23 may be spaced apart from each other with the central region of the body 110 interposed therebetween. The first upper recess R21 and the third upper recess R23 may be provided while being connected to each other around the central region of the body 110 in a shape of a closed loop. In addition, the second upper recess R22 may be provided in the central region of the body 110. The second upper recess R22 may be provided in a space surrounded by the first upper recess R21 and the third upper recess R23.

Figure 27:
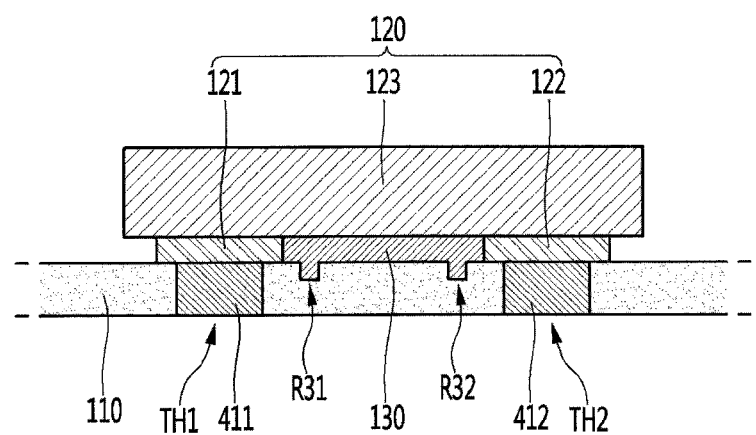
FIGS. 27 to 29 are views illustrating another modification example of a body applied to a light emitting device package according to an embodiment of the present invention.
Figure 28:
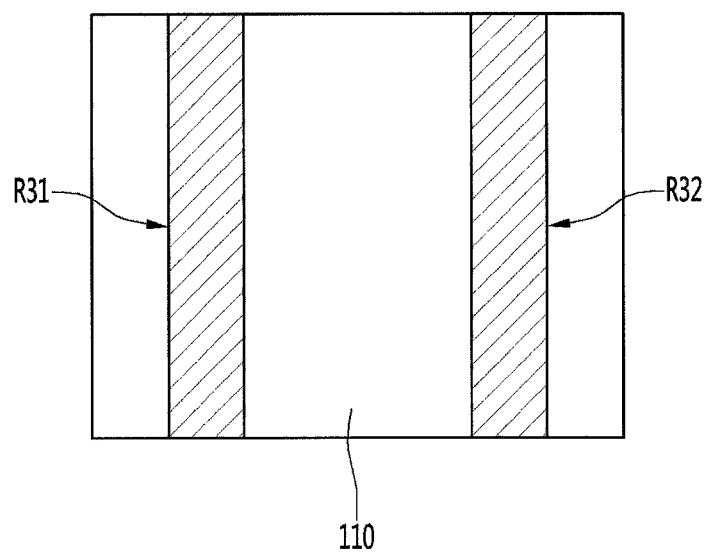
Figure 29:
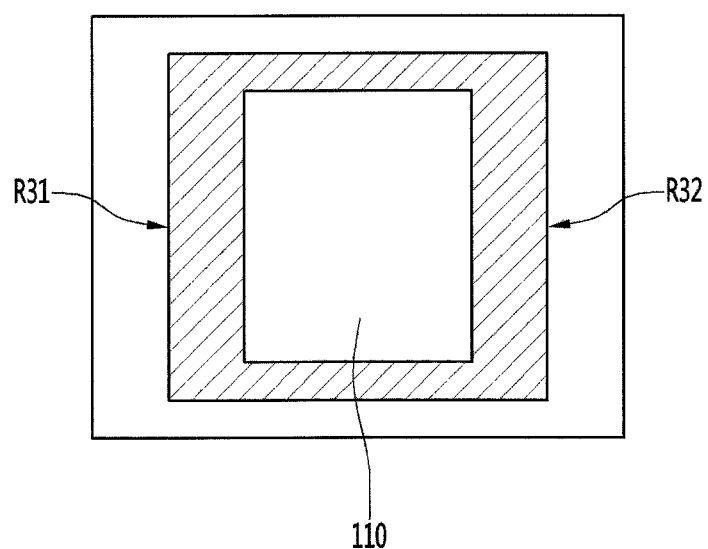

In addition, FIGS. 27 to 29 are views illustrating another modification example of a body applied to a light emitting device package according to an embodiment of the present invention.

According to the light emitting device package 300 of the embodiment, as shown in FIG. 27, the body 110 may include at least two recesses provided on the upper surface thereof.

For example, the body 110 may include a first upper recess R31 provided toward the first through hole TH1 about the central region of the upper surface of the body. The first upper recess R31 may be concavely provided from the upper surface of the body 110 in the direction to the lower surface thereof.

In addition, the body 110 may include a third upper recess R32 provided toward the second through hole TH2 about the central region of the upper surface of the body. The second upper recess R32 may be concavely provided from the upper surface of the body 110 in the direction to the lower surface thereof.

According to the light emitting device package 300 of the embodiments, a first adhesive 130 may be provided in the first upper recess R31 and the second upper recess R32. The first adhesive 130 may be disposed between the light emitting device 120 and the body 110. The first adhesive 130 may be disposed between the first electrode 121 and the second electrode 122. For example, the first adhesive 130 may be disposed in contact with the side surface of the first electrode 121 and the side surface of the second electrode 122.

The first upper recess R31 and the second upper recess R32 may provide a suitable space under the light emitting device 120 to perform a sort of underfill process.

The first upper recess R31 and the second upper recess R32 may be provided at the first depth or more so that the first adhesive 130 is sufficiently provided between the lower surface of the light emitting device 120 and the upper surface of the body 110. In addition, the first upper recess R31 and the second upper recess R32 may be provided at the second depth or less to provide stable strength of the body 110.

The adhesive 130 may provide stable fixing strength between the light emitting device 120 and the body 110. For example, the first adhesive 130 may be disposed in direct contact with the upper surface of the body 110. In addition, the adhesive 130 may be disposed in direct contact with the lower surface of the light emitting device 120.

The first upper recess R31 and the first adhesive 130 may prevent the first conductive layer 411 provided in the first through hole TH1 from moving to the lower region of the light emitting device 120. In addition, the second upper recess R32 and the first adhesive 130 may prevent the second conductive layer 412 provided in the second through hole TH2 from moving to the lower region of the light emitting device 120. Accordingly, the light emitting device 120 may be prevented from electrical short or deterioration caused by the movement of the first and second conductive layers 411 and 412.

In addition, FIG. 27 is a sectional view of the body 110 applied to the light emitting device package according to the embodiment, and FIGS. 28 and 29 are plan views of the body 110 shown in FIG. 27.

For example, as shown in FIG. 28, the first upper recess R31 and the second upper recess R32 may be spaced apart from and parallel to each other on the upper surface of the body 110 in one direction. The first upper recess R31 and the upper second recess R32 may extend on the upper surface of the body 110 in one direction.

In addition, as shown in FIG. 29, the first upper recess R31 and the second upper recess R32 may be spaced apart from each other with the central region of the body 110 interposed therebetween. In addition, the first upper recess R31 and the second upper recess R32 may be provided while being connected to each other around the central region of the body 110 in a shape of a closed loop.

Figure 30:
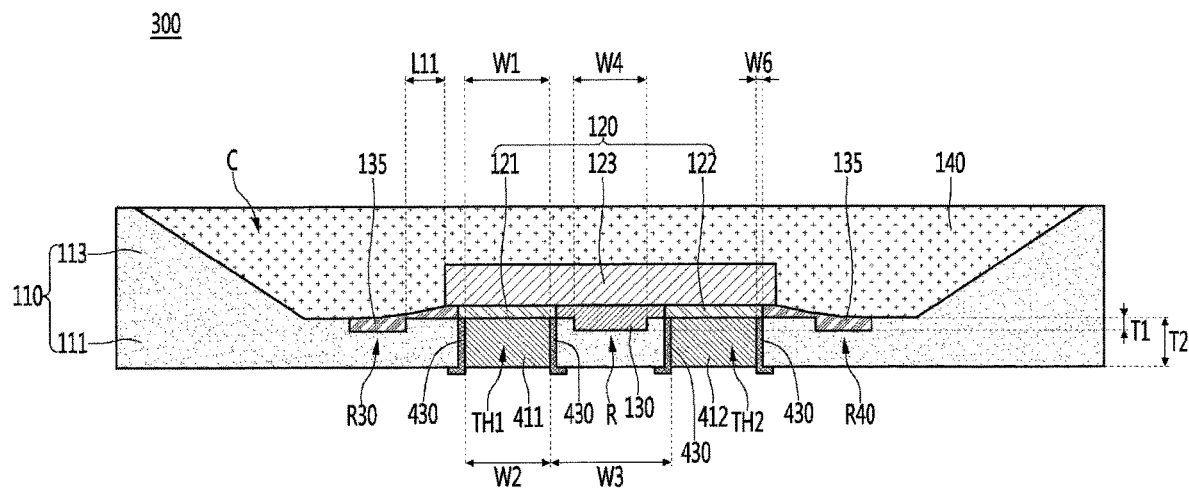
FIG. 30 is a view illustrating still another example of a light emitting device package according to an embodiment of the present invention.

In addition, FIG. 30 is a view illustrating still another example of a light emitting device package according to an embodiment of the present invention. As shown in FIG. 30, the light emitting device package according to the embodiment may further include a metal layer 430 compared to the light emitting device package described with reference to FIGS. 19 to 29.

The metal layer 430 may be provided in the first through hole TH1 and the second through hole TH2. The metal layer 430 may be provided on a side wall of the body 110 providing the first through hole TH1 and a side wall of the body 110 providing the second through hole TH2.

The metal layer 430 may be disposed between the body 110 provided therein with the first through hole TH1 and the first conductive layer 411. In addition, the metal layer 430 may be disposed between the body 110 provided therein with the second through hole TH2 and the second conductive layer 412.

In addition, according to the embodiment, the metal layer 430 may be provided on the lower surface of the body 110 adjacent to the first and second through holes TH1 and TH2.

The metal layer 430 may be formed of a material having a physical property of good adhesive strength onto the body 110. In addition, the metal layer 430 may be formed of a material having a physical property of good adhesive strength onto the first and second conductive layers 411 and 412.

Accordingly, the first and second conductive layers 411 and 412 may be stably provided in the first and second through holes TH1 and TH2. According to the embodiment, even when the adhesive strength between the first and second conductive layers 411 and 412 and the body 110 is bad, the first and second conductive layers 411 and 412 may be stably provided in the first and second through holes TH1 and TH2 by the metal layer 430.

In addition, the light emitting device package according to the embodiment described above with reference to FIGS. 19 to 30 is described based on the situation that the first conductive layer 411 and the second conductive layer 412 are filled in the first through hole TH1 and the second through hole TH2, respectively.

However, according to the light emitting device package of another embodiment, as described with reference to FIGS. 1 to 6, the light emitting device package may be supplied with a structure that the conductive materials are not filled in the first through hole TH1 and the second through hole TH2.

In addition, the light emitting device package according to the embodiment described with reference to FIGS. 19 to 30 may be mounted on the sub-mount, the circuit board or the like similarly to the situation described with reference to FIG. 7, FIG. 14, or FIG. 15.

In addition, the light emitting device package described above may be provided with a flip chip light emitting device as an example.

For example, the flip chip light emitting device may be provided as a reflective flip chip light emitting device that emits light in six-surfaced directions, or may be provided as a reflective flip chip light emitting device that emits light in five-surfaced directions.

The reflective flip chip light emitting device that emits light in the five-surfaced directions may have a structure in which a reflection layer is disposed in a direction close to the package body 110. For example, the reflective flip chip light emitting device may include an insulating reflective layer (such as a distributed bragg reflector, and an omni directional reflector) and/or a conductive reflective layer (such as Ag, Al, Ni, and Au) between the first and second electrode pads and a light emitting structure.

In addition, the flip chip light emitting device that emits the light in the six-surfaced directions may include a first electrode electrically connected to the first conductive semiconductor layer and a second electrode electrically connected to the second conductive semiconductor layer, and may be provided as a general horizontal type light emitting device in which light is emitted between the first electrode and the second electrode.

In addition, the flip chip light emitting device that emits light in the six-surfaced directions may be provided as a transmissive flip chip light emitting device including both a reflective region disposed therein with a reflective layer between the first and second electrode pads, and a transmissive region that emits the light.

Herein, the transmissive flip chip light emitting device refers to a device that emits the light to six surfaces of an upper surface, four side surfaces, and a lower surface thereof. In addition, the reflective flip chip light emitting device refers to a device that emits the light to five surfaces of an upper surface and four side surfaces thereof.

Hereinafter, an example of the flip chip light emitting device applied to the light emitting device package according to the embodiment of the present invention will be described with reference to the accompanying drawings.

Figure 31:
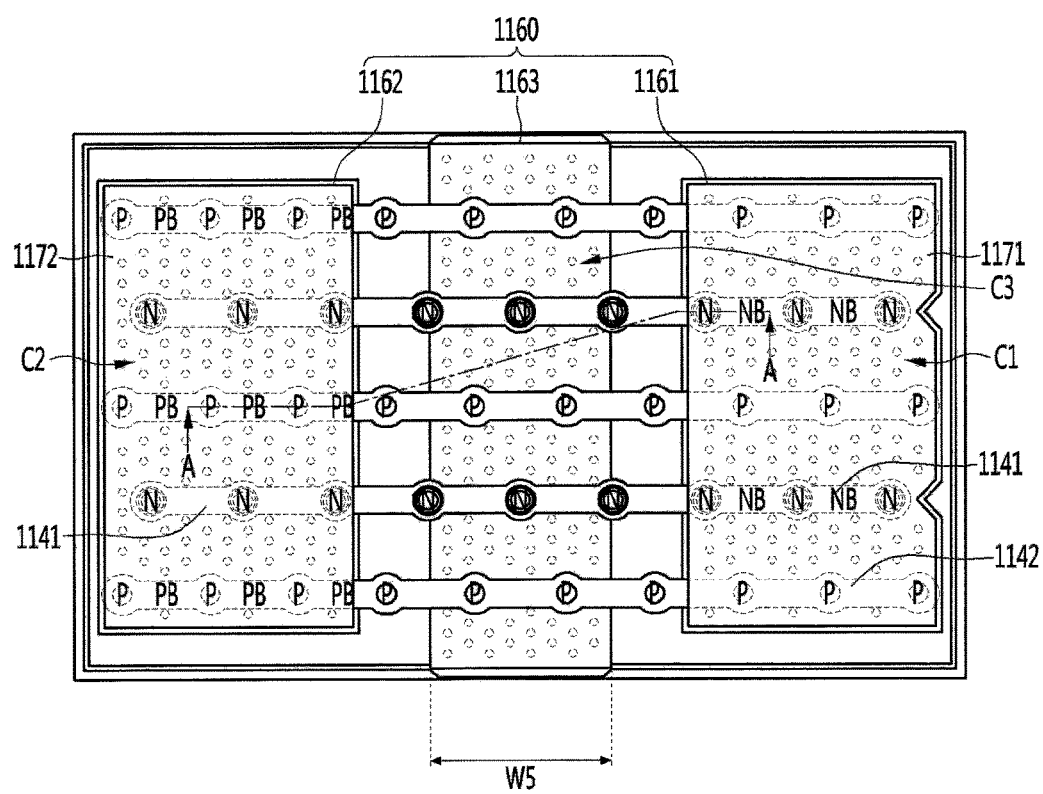
FIG. 31 is a plan view illustrating a light emitting device according to an embodiment of the present invention.

First, the light emitting device according to the embodiment of the present invention will be described with reference to FIGS. 31 and 32. FIG. 31 is a plan view illustrating a light emitting device according to an embodiment of the present invention, and FIG. 32 is a sectional view taken along the line A-A of a light emitting device shown in FIG. 31.

For better understanding, though disposed under the first electrode 1171 and the second electrode 1172, FIG. 31 shows a first sub-electrode 1141 electrically connected to the first electrode 1171, and a second sub-electrode 1142 electrically connected to the second electrode 1172.

Figure 32:
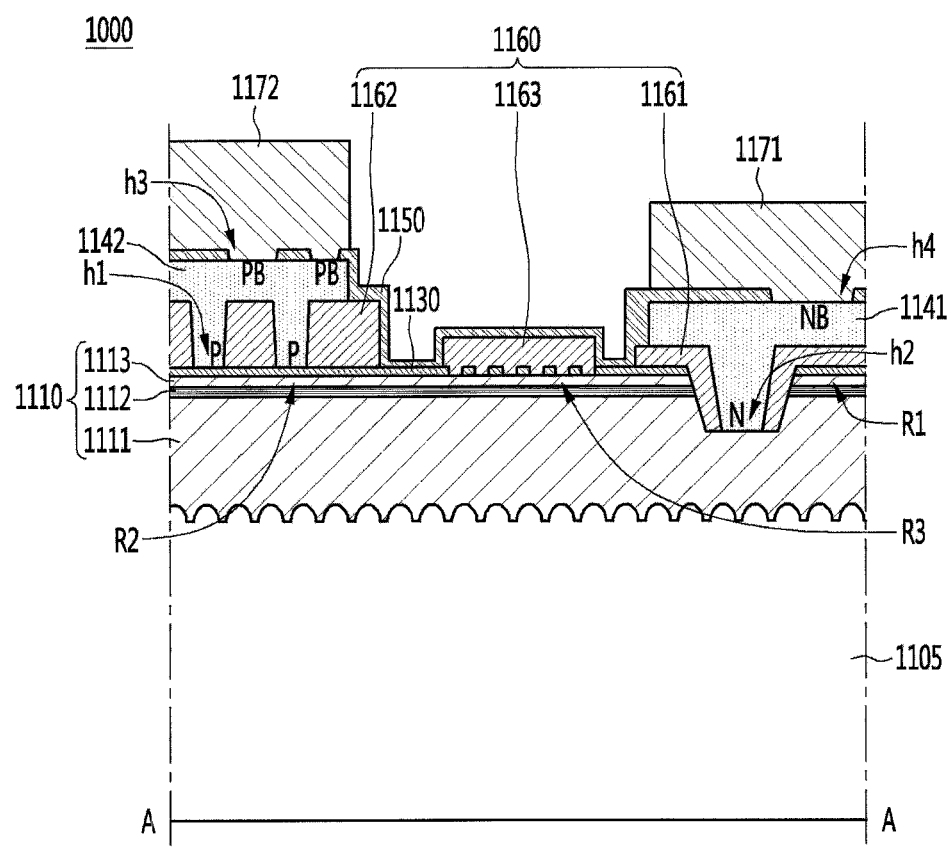
FIG. 32 is a sectional view taken along the line A-A of a light emitting device shown in FIG. 31.

As shown in FIGS. 31 and 32, the light emitting device 1100 according to the embodiment may include a light emitting structure 1110 disposed on a substrate 1105.

The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductive semiconductor layer 1111, an active layer 1112, and a second conductive semiconductor layer 1113. The active layer 1112 may be disposed between the first conductive semiconductor layer 1111 and the second conductive semiconductor layer 1113. For example, the active layer 1112 may be disposed on the first conductive semiconductor layer 1111, and the second conductive semiconductor layer 1113 may be disposed on the active layer 1112.

According to the embodiment, the first conductive semiconductor layer 1111 may be provided as an n-type semiconductor layer, and the second conductive semiconductor layer 1113 may be provided as a p-type semiconductor layer. According to another embodiment, the first conductive semiconductor layer 1111 may be provided as a p-type semiconductor layer, and the second conductive semiconductor layer 1113 may be provided as an n-type semiconductor layer.

Hereinafter, for the descriptive convenience, it will be described with reference to the situation that the first conductive semiconductor layer 1111 is provided as an n-type semiconductor layer and the second conductive semiconductor layer 1113 is provided as a p-type semiconductor layer.

As shown in FIG. 32, the light emitting device 1100 according to the embodiment may include an ohmic contact layer 1130. The ohmic contact layer 1130 may increase light output by improving a current diffusion. An arranged position and a shape of the ohmic contact layer 1130 will be further described with reference to the method of manufacturing the light emitting device according to the embodiment.

For example, the ohmic contact layer 1130 may include at least one selected from the group including a metal, metal oxide, and metal nitride. The ohmic contact layer 1130 may include a light transmissive material.

The ohmic contact layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

As shown in FIGS. 32 and 32, the light emitting device 1100 according to the embodiment may include a reflective layer 1160. The reflective layer 1160 may include a first reflective layer 1161, a second reflective layer 1162, and a third reflective layer 1163. The reflective layer 1160 may be disposed on the ohmic contact layer 1130.

The second reflective layer 1162 may include a first opening h1 for exposing the ohmic contact layer 1130. The second reflective layer 1162 may include a plurality of first openings h1 disposed on the ohmic contact layer 1130.

The first reflective layer 1161 may include second openings h2 for exposing an upper surface of the first conductive semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

For example, the width W5 of the third reflective layer 1163 may be smaller than the width W4 of the recess R described with reference to FIGS. 1 to 30.

Accordingly, light emitted between the first reflective layer 1161 and the third reflective layer 1163 may be incident to the adhesive 130 disposed in the region of the recess R. The light emitted in a downward direction of the light emitting device may be optically diffused by the adhesive 130 and the light extraction efficiency may be improved.

In addition, light emitted between the second reflective layer 1162 and the third reflective layer 1163 may be incident to the adhesive 130 disposed in the region of the recess R. The light emitted in a downward direction of the light emitting device may be optically diffused by the adhesive 130 and the light extraction efficiency may be improved.

The reflective layer 1160 according to the embodiment may make contact with the second conductive semiconductor layer 1113 through contact holes provided in the ohmic contact layer 1130. The reflective layer 1160 may physically make contact with an upper surface of the second conductive semiconductor layer 1113 through the contact holes provided in the ohmic contact layer 1130.

The shape of the ohmic contact layer 1130 and the shape of the reflective layer 1160 according to the embodiment will be further described with reference to the method of manufacturing the light emitting device according to the embodiment.

The reflective layer 1160 may be provided as an insulating reflective layer. For example, the reflective layer 1160 may be provided as a distributed bragg reflector (DBR) layer. In addition, the reflective layer 1160 may be provided as an omni directional reflector (ODR) layer. In addition, the reflective layer 1160 may be provided by stacking the DBR layer and the ODR layer.

As shown in FIGS. 31 and 32, the light emitting device 1100 according to the embodiment may include the first sub-electrode 1141 and the second sub-electrode 1142.

The first sub-electrode 1141 may be electrically connected to the first conductive semiconductor layer 1111 in the second opening h2. The first sub-electrode 1141 may be disposed on the first conductive semiconductor layer 1111. For example, according to the light emitting device 1100 of the embodiment, the first sub-electrode 1141 may be disposed on the upper surface of the first conductive semiconductor layer 1111 in the recess provided to a partial region of the first conductive semiconductor layer 1111 through the second conductive semiconductor layer 1113 and the active layer 1112.

The first sub-electrode 1141 may be electrically connected to the upper surface of the first conductive semiconductor layer 1111 through the second opening h2 provided in the first reflective layer 1161. The second opening h2 and the recess may vertically overlap each other. For example, as shown in FIGS. 31 and 32, the first sub-electrode 1141 may make direct contact with the upper surface of the first conductive semiconductor layer 1111 in recess regions.

The second sub-electrode 1142 may be electrically connected to the second conductive semiconductor layer 1113. The second sub-electrode 1142 may be disposed on the second conductive semiconductor layer 1113. According to the embodiment, the ohmic contact layer 1130 may be disposed between the second sub-electrode 1142 and the second conductive semiconductor layer 1113.

The second sub-electrode 1142 may be electrically connected to the second conductive semiconductor layer 1113 through the first opening h1 provided in the second reflective layer 1162. For example, as shown in FIGS. 31 and 32, the second sub-electrode 1142 may be electrically connected to the second conductive semiconductor layer 1113 through the ohmic contact layer 1130 in P regions.

As shown in FIGS. 31 and 32, the second sub-electrode 1142 may make direct contact with an upper surface of the ohmic contact layer 1130 through a plurality of first openings h1 provided in the second reflective layer 1162 in the P regions.

According to the embodiment, as shown in FIGS. 31 and 32, the first sub-electrode 1141 and the second sub-electrode 1142 may have polarities to each other and may be spaced apart from each other.

For example, the first sub-electrode 1141 may be provided in line shapes. In addition, for example, the second sub-electrode 1142 may be provided in line shapes. The first sub-electrode 1141 may be disposed between neighboring second sub-electrodes 1142. The second sub-electrode 1142 may be disposed between neighboring first sub-electrodes 1141.

When the first sub-electrode 1141 and the second sub-electrode 1142 have polarities different from each other, the number of the electrodes may be different from each other. For example, when the first sub-electrode 1141 is configured to be an n-electrode and the second sub-electrode 1142 be a p-electrode, the number of the second sub-electrodes 1142 may be more. When an electrical conductivity and/or resistance of the second conductive semiconductor layer 1113 and the first conductive semiconductor layer 1111 are different from each other, electrons injected into the light emitting structure 1110 may be balanced with positive holes by the first sub-electrode 1141 and the second sub electrode 1142, thus optical characteristics of the light emitting device may be improved.

The first sub-electrode 1141 and the second sub-electrode 1142 may be provided with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

As shown in FIGS. 31 and 32, the light emitting device 1100 according to the embodiment may include a protective layer 1150.

The protective layer 1150 may include third openings h3 for exposing the second sub-electrode 1142. The third openings h3 may be disposed corresponding to PB regions provided in the second sub-electrode 1142.

In addition, the protective layer 1150 may include fourth openings h4 for exposing the first sub-electrode 1141. The fourth openings h4 may be disposed corresponding to NB regions provided in the first sub-electrode 1141.

The protective layer 1150 may be disposed on the reflective layer 1160. The protective layer 1150 may be disposed on the first reflective layer 1161, the second reflective layer 1162, and the third reflective layer 1163.

For example, the protective layer 1150 may be provided as an insulating material. For example, the protective layer 1150 may be formed of at least one material selected from the group including SixOy, SiOxNy, SixNy, and AlxOy.

As shown in FIGS. 31 and 32, the light emitting device 1100 according to the embodiment may include the first electrode 1171 and the second electrode 1172 disposed on the protective layer 1150.

The first electrode 1171 may be disposed on the first reflective layer 1161. In addition, the second electrode 1172 may be disposed on the second reflective layer 1162. The second electrode 1172 may be spaced apart from the first electrode 1171.

The first electrode 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first electrode 1171 may be uniformly distributed in a horizontal direction of the first sub-electrode 1141, thus the current may be uniformly injected in the NB regions.

In addition, the second electrode 1172 may make contact with an upper surface of the second sub-electrode 1142 through the third openings h3 provided in the protective layer 1150 in the PB regions. When the PB regions and the first openings h1 are not vertically overlapped with each other, a current injected into the second electrode 1172 may be uniformly distributed in a horizontal direction of the second sub-electrode 1142, thus the current may be uniformly injected in the PB regions.

Thus, according to the light emitting device 1100 of the embodiment, the first electrode 1171 may make contact with the first sub-electrode 1141 in the fourth openings h4. In addition, the second electrode 1172 may make contact with the second sub-electrode 1142 in the multiple regions. Thus, according to the embodiment, because the power may be supplied through the regions, a current dispersion effect can be generated and an operating voltage can be reduced according to the increase of a contact area and the dispersion of a contact region.

In addition, according to the light emitting device 1100 of the embodiment, as shown in FIG. 32, the first reflective layer 1161 is disposed under the first sub-electrode 1141 and the second reflective layer 1162 is disposed under the second sub-electrode 1142. Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved.

For example, the first reflective layer 1161 and the second reflective layer 1162 may be formed of an insulating material, and have a structure such as a DBR structure using a material having high reflectivity to reflect the light emitted from the active layer 1112.

The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of $TiO_2$, $SiO_2$, $Ta_2O_5$, and $HfO_2$.

Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112.

In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the first electrode 1171 and the second electrode 1172 are not provided among surfaces on which the first electrode 1171 and the second electrode 1172 are disposed.

Specifically, the light emitted from the light emitting structure 1110 may be emitted to the outside through a region where the third reflective layer 1163 is not provided among the surfaces on which the first electrode 1171 and the second electrode 1172 are disposed.

Accordingly, the light emitting device 1100 according to the embodiment may emit the light in six-surfaced directions surrounding the light emitting structure 1110, and remarkably improve the light intensity.

In addition, according to the light emitting device of the embodiment, when viewed from the top of the light emitting device 1100, the sum of the areas of the first electrode 1171 and the second electrode 1172 is less than or equal to 60% of the total area of the upper surface of the light emitting device 1100 on which the first electrode 1171 and the second electrode 1172 are disposed.

For example, the total area of the upper surface of the light emitting device 1100 may correspond to the area defined by a lateral length and a longitudinal length of the lower surface of the first conductive semiconductor layer 1111 of the light emitting structure 1110. In addition, the total area of the upper surface of the light emitting device 1100 may correspond to the area of an upper surface or a lower surface of the substrate 1105.

Accordingly, the sum of the areas of the first electrode 1171 and the second electrode 1172 is equal to or less than 60% of the total area of the light emitting device 1100, so that the amount of light emitted to the surface on which the first electrode 1171 and the second electrode 1172 are disposed may be increased. Thus, according to the embodiment, because the amount of the light emitted in the six-surfaced directions of the light emitting device 1100 is increased, the light extraction efficiency may be improved and the light intensity Po may be increased.

In addition, when viewed from the top of the light emitting device, the sum of the areas of the first electrode 1171 and the second electrode 1172 is equal to or greater than 30% of the total area of the light emitting device 1100.

Accordingly, the sum of the areas of the first electrode 1171 and the second electrode 1172 is equal to or greater than 30% of the total area of the light emitting device 1100, so that a stable mount may be performed through the first electrode 1171 and the second electrode 1172, and electrical characteristics of the light emitting device 1100 may be ensured.

The sum of the areas of the first electrode 1171 and the second electrode 1172 may be selected as 30% to 60% with respect to the total area of the light emitting device 1100 in consideration of ensuring the light extraction efficiency and the bonding stability.

In other words, when the sum of the areas of the first electrode 1171 and the second electrode 1172 is 30% to 100% with respect to the total area of the light emitting device 1100, the electrical characteristics of the light emitting device 1100 may be ensured and bonding strength to be mounted on the light emitting device package may be ensured, so that stable mount may be performed.

In addition, when the sum of the areas of the first electrode 1171 and the second electrode 1172 is more than 0% and equal to or less than 60% of the total area of the light emitting device 1100, the amount of light emitted to the surface on which the first electrode 1171 and the second electrode 1172 are disposed increases, so that the light extraction efficiency of the light emitting device 1100 may be improved and the light intensity Po may be increased.

In the embodiment, the sum of the areas of the first electrode 1171 and the second electrode 1172 is selected as 30% to 60% of the total area of the light emitting device 1100 to ensure the electrical characteristics of the light emitting device 1100 and the bonding strength to be mounted on the light emitting device package and increase the light intensity.

In addition, according to the light emitting device 1100 of the embodiment, the third reflective layer 1163 may be disposed between the first electrode 1171 and the second electrode 1172. For example, the length W5 of the third reflective layer 1163 in major axial direction of the light emitting device 1100 may correspond to the distance between the first electrode 1171 and the second electrode 1172. In addition, for example, the area of the third reflective layer 1163 may be 10% to 25% of the entire upper surface of the light emitting device 1100.

When the area of the third reflective layer 1163 is 10% or more of the entire upper surface of the light emitting device 1100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1100 to ensure the light extraction efficiency more, and the area of the third reflective layer 1163 may be arranged to more than 25% and less than 100% of the entire upper surface of the light emitting device 1100 to prevent the package body from being discolored or cracked.

In addition, the light generated from the light emitting structure 1110 may be transmitted and emitted through a second region provided between a side surface arranged in the major axial direction and the first electrode 1171 or the second electrode 1172 adjacent to the side surface.

In addition, the light generated from the light emitting structure 1110 may be transmitted and emitted through a third region provided between a side surface arranged in a minor axial direction and the first electrode 1171 or the second electrode 1172 adjacent to the side surface.

According to the embodiment, the size of the first reflective layer 1161 may be several micrometers larger than the size of the first electrode 1171. For example, the area of the first reflective layer 1161 may be provided in a size to completely cover the area of the first electrode 1171. In consideration of a process error, for example, the length of one side of the first reflective layer 1161 may be greater than the length of one side of the first electrode 1171 by about 4 micrometers to about 10 micrometers.

In addition, the size of the second reflective layer 1162 may be several micrometers larger than the size of the second electrode 1172. For example, the area of the second reflective layer 1162 may be provided in a size to completely cover the area of the second electrode 1172. In consideration of a process error, for example, the length of one side of the second reflective layer 1162 may be greater than the length of one side of the second electrode 1172 by about 4 micrometers to about 10 micrometers.

According to the embodiment, light emitted from the light emitting structure 1110 may be reflected without being incident on the first electrode 1171 and the second electrode 1172 by the first reflective layer 1161 and the second reflective layer 1162. Thus, according to the embodiment, a loss of the light generated and emitted from the light emitting structure 1110 and incident to the first electrode 1171 and the second electrode 1172 may be minimized.

In addition, according to the light emitting device 1100 of the embodiment, because the third reflective layer 1163 is disposed between the first electrode 1171 and the second electrode 1172, the amount of light emitted between the first electrode 1171 and the second electrode 1172 may be adjusted.

As described above, the light emitting device 1100 according to the embodiment may be provided as a light emitting device package after being mounted, for example, in a flip chip bonding scheme. Herein, when the package body mounted thereon with the light emitting device 1100 is provided with resin or the like, the package body is discolored or cracked in the lower region of the light emitting device 1100 due to strong short-wavelength light emitted from the light emitting device 1100.

However, according to the light emitting device 1100 of the embodiment, because the amount of light emitted between the region on which the first electrode 1171 and the second electrode 1172 are disposed is adjusted, the package body disposed in the lower region of the light emitting device 1100 may be prevented from being discolored or cracked.

According to the embodiment, the light generated from the light emitting structure 1100 may be transmitted and emitted through 20% or more of the area of the upper surface of the light emitting device 1100 on which the first electrode 1171, the second electrode 1172 and the third reflective layer 1163.

Thus, according to the embodiment, because the amount of the light emitted in the six-surfaced directions of the light emitting device 1100 is increased, the light extraction efficiency may be improved and the light intensity Po may be increased. In addition, the package body disposed adjacent to the lower surface of the light emitting device 1100 may be prevented from being discolored or cracked.

In addition, according to the light emitting device 1100 of the embodiment, a plurality of contact holes C1, C2, and C3 may be provided in the ohmic contact layer 1130. The second conductive semiconductor layer 1113 may be bonded to the reflective layer 1160 through the plurality of contact holes C1, C2, and C3 provided in the ohmic contact layer 1130. The reflective layer 1160 makes directly contact with the second conductive semiconductor layer 1113, so that the adhesive strength may be improved as compared with the situation that the reflective layer 1160 makes contact with the ohmic contact layer 1130.

When the reflective layer 1160 makes direct contact with only the ohmic contact layer 1130, the bonding strength or adhesive strength between the reflective layer 1160 and the ohmic contact layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the ohmic contact layer 1130 is weak, peeling may incur between the two layers. Thus, when the peeling incurs between the reflective layer 1160 and the ohmic contact layer 1130, the characteristics of the light emitting device 1100 may deteriorate and the reliability of the light emitting device 1100 may not be ensured.

However, according to the embodiment, because the reflective layer 1160 can make direct contact with the second conductive semiconductor layer 1113, the bonding strength and adhesive strength may be stably provided between the reflective layer 1160, the ohmic contact layer 1130, and the second conductive semiconductor layer 1113.

Thus, according to the embodiment, because the bonding strength between the reflective layer 1160 and the second conductive semiconductor layer 1113 may be stably provided, the reflective layer 1160 may be prevented from being peeled off from the ohmic contact layer 1130. In addition, because the bonding strength between the reflective layer 1160 and the second conductive semiconductor layer 1113 may be stably provided, the reliability of the light emitting device 1100 may be improved.

In addition, as described above, the ohmic contact layer 1130 may be provided with the contact holes C1, C2, and C3. The light emitted from the active layer 1112 may be incident to and reflected by the reflective layer 1160 through the contact holes C1, C2, and C3 provided in the ohmic contact layer 1130. Accordingly, the loss of the light generated from the active layer 1112 and incident to the ohmic contact layer 1130 is reduced, so that the light extraction efficiency may be improved. Thus, according to the light emitting device 1100 of the embodiment, the light intensity may be improved.

Hereinafter, the method of manufacturing the light emitting device according to the embodiment will be described with reference to the accompanying drawings. Upon description of the method of manufacturing the light emitting device according to the embodiment, description overlapped with those described with reference to FIGS. 31 to 32 may be omitted.

Figure 33A:
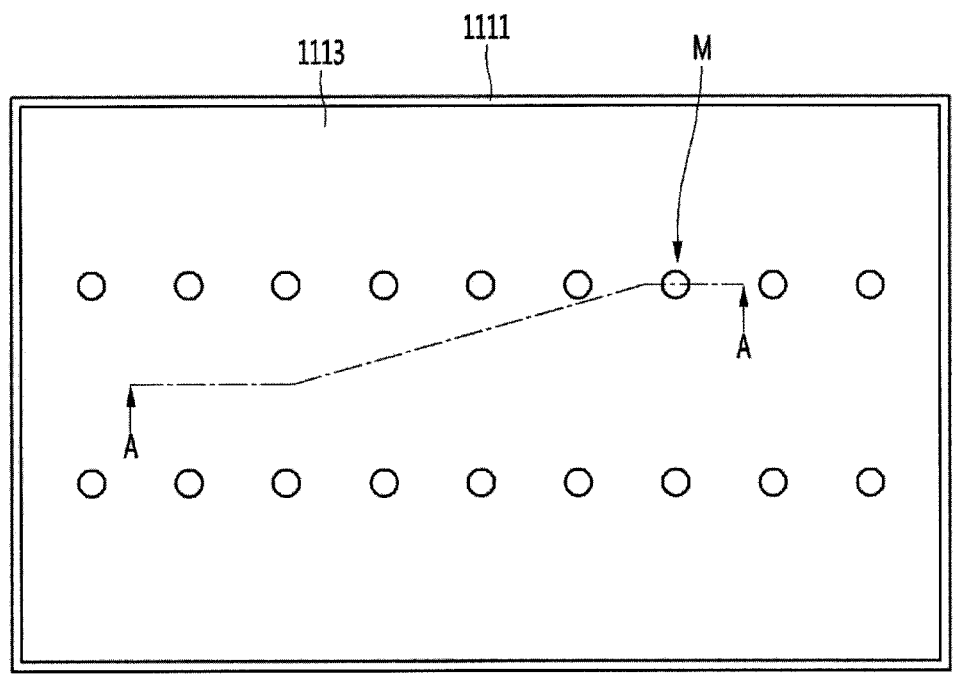
FIGS. 33a and 33b are views describing a step of forming a semiconductor layer according to a method of manufacturing a light emitting device according to an embodiment of the present invention.
Figure 33B:
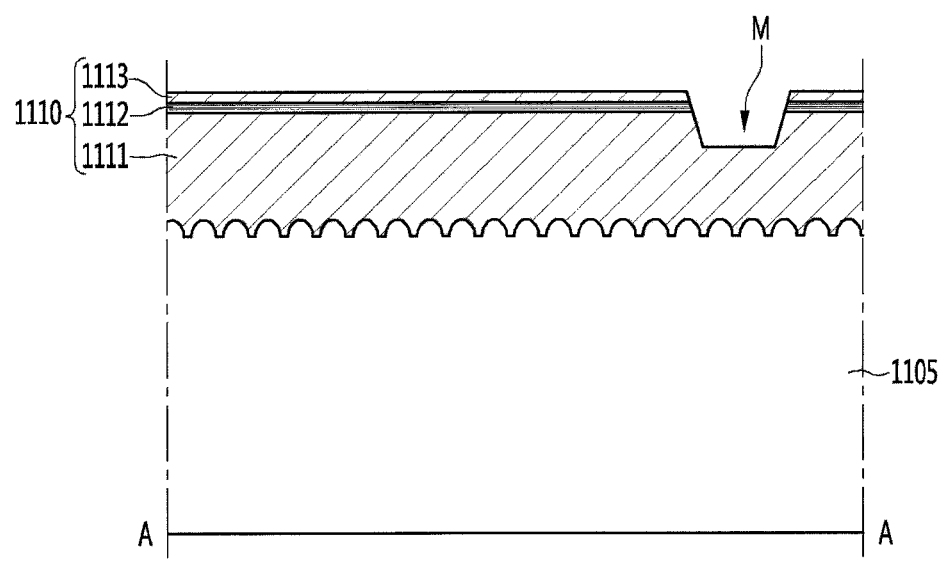

First, according to the method of manufacturing the light emitting device of the embodiment, as shown in FIGS. 33*a* and 33*b*, the light emitting structure 1110 may be provided on the substrate 1105. FIG. 33*a* is a plan view showing a shape of the light emitting structure 1110 provided according to the method of manufacturing the light emitting device according to the embodiment, and FIG. 33*b* is a process sectional view taken along the line A-A of the light emitting device shown in FIG. 33*a*.

According to the embodiment, the light emitting structure 1110 may be provided on the substrate 1105. For example, the first conductive semiconductor layer 1111, the active layer 1112, and the second conductive semiconductor layer 1113 may be provided on the substrate 1105.

According to the embodiment, a part of the first conductive semiconductor layer 1111 may be exposed by a mesa etching process. The light emitting structure 1110 may include mesa openings M for exposing the first conductive semiconductor layer 1111 by mesa etching. For example, the mesa opening M may be provided in circular shapes. In addition, the mesa opening M also may be referred to as a recess. The mesa opening M may be provided in various shapes such as an oval shape or a polygonal shape as well as a circular shape.

Figure 34A:
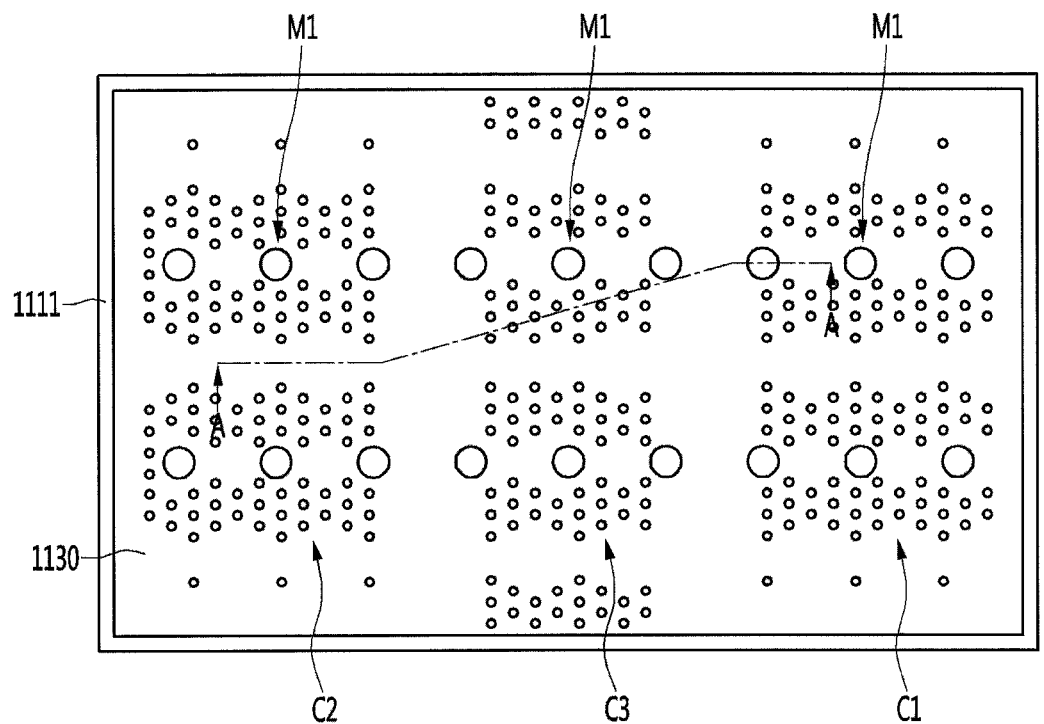
FIGS. 34a and 34b are views describing a step of forming an ohmic contact layer by a method of manufacturing a light emitting device according to an embodiment of the present invention.
Figure 34B:
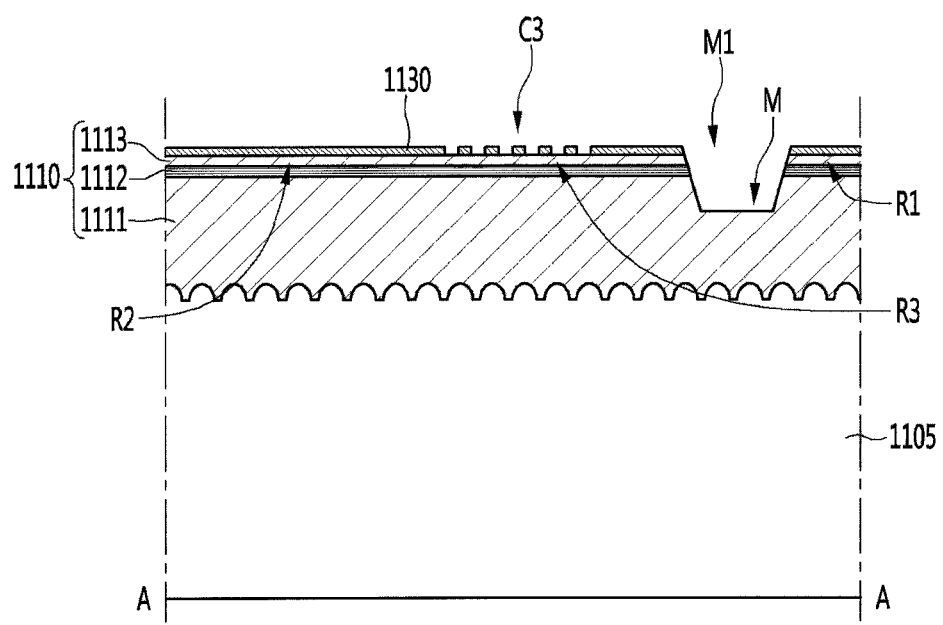

Next, as shown in FIGS. 34*a* and 34*b*, the ohmic contact layer 1130 may be provided. FIG. 34*a* is a plan view showing a shape of the ohmic contact layer 1130 formed according to the method of manufacturing the light emitting device according to the embodiment, and FIG. 34*b* is a process sectional view taken along the line A-A of the light emitting device shown in FIG. 34*a*.

According to the embodiment, the ohmic contact layer 1130 may be provided on the second conductive semiconductor layer 1113. The ohmic contact layer 1130 may include openings M1 provided regions corresponding to the mesa openings M.

For example, the openings M1 may be provided in circular shapes. The openings M1 may be provided in various shapes such as an oval shape or a polygonal shape as well as a circular shape.

The ohmic contact layer 1130 may include a first region R1, a second region R2, and a third region R3. The first region R1 and the second region R2 may be spaced apart from each other. In addition, the third region R3 may be arranged between the first region R1 and the second region R2.

The first region R1 may include the openings M1 provided in the regions corresponding to the mesa openings M of the light emitting structure 1110. In addition, the first region R1 may include multiple first contact holes C1. For example, the first contact holes C1 may be plurally provided around the opening M1.

The second region R2 may include the openings M1 provided in the regions corresponding to the mesa openings M of the light emitting structure 1110. In addition, the second region R2 may include multiple second contact holes C2. For example, the second contact holes C2 may be plurally provided around the opening M2.

The third region R3 may include the openings M1 provided in the regions corresponding to the mesa openings M of the light emitting structure 1110. In addition, the first region R1 may include multiple first contact holes C1. For example, the first contact holes C1 may be plurally provided around the opening M1.

According to the embodiment, the first contact hole C1, the second contact hole C2, and the third contact hole C3 may have a diameter of several micrometers to several tens of micrometers. For example, the first contact hole C1, the second contact hole C2, and the third contact hole C3 may have a diameter of 7 micrometers to 20 micrometers.

The first contact hole C1, the second contact hole C2, and the third contact hole C3 may be provided in various shapes such as an oval shape or a polygonal shape as well as a circular shape.

According to the embodiment, the second conductive semiconductor layer 1113 disposed under the ohmic contact layer 1130 may be exposed by the first contact hole C1, the second contact hole C2, and the third contact hole C3.

Functions of the opening M1, the first contact hole C1, the second contact hole C2, and the third contact hole C3 will be further described with reference to the following subsequent process.

Figure 35A:
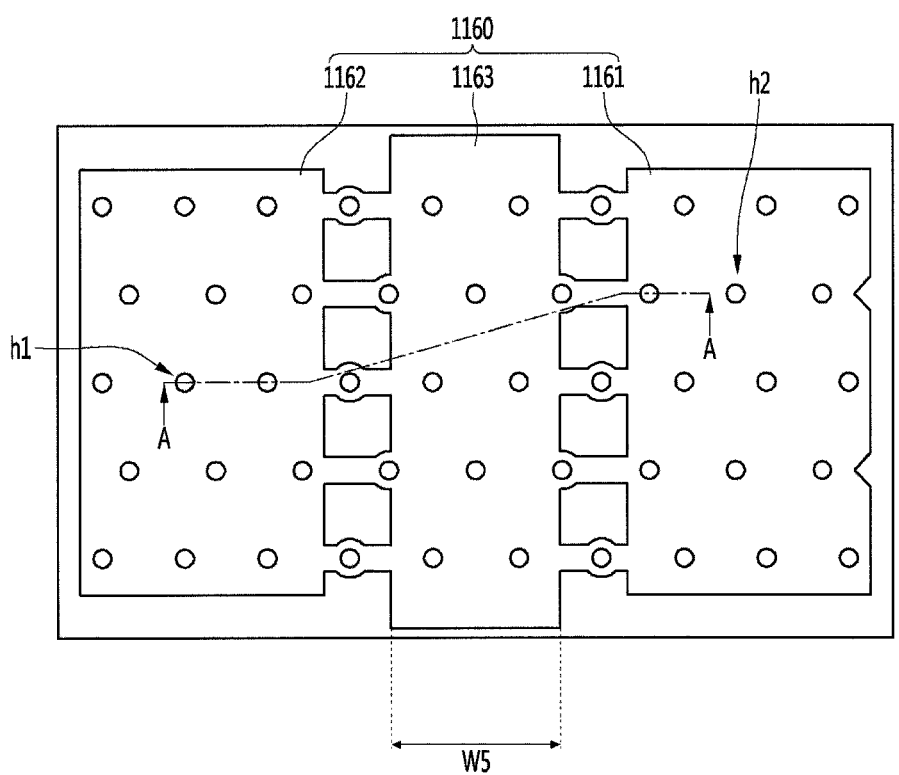
FIGS. 35a and 35b are views describing a step of forming a reflective layer by a method of manufacturing a light emitting device according to an embodiment of the present invention.
Figure 35B:
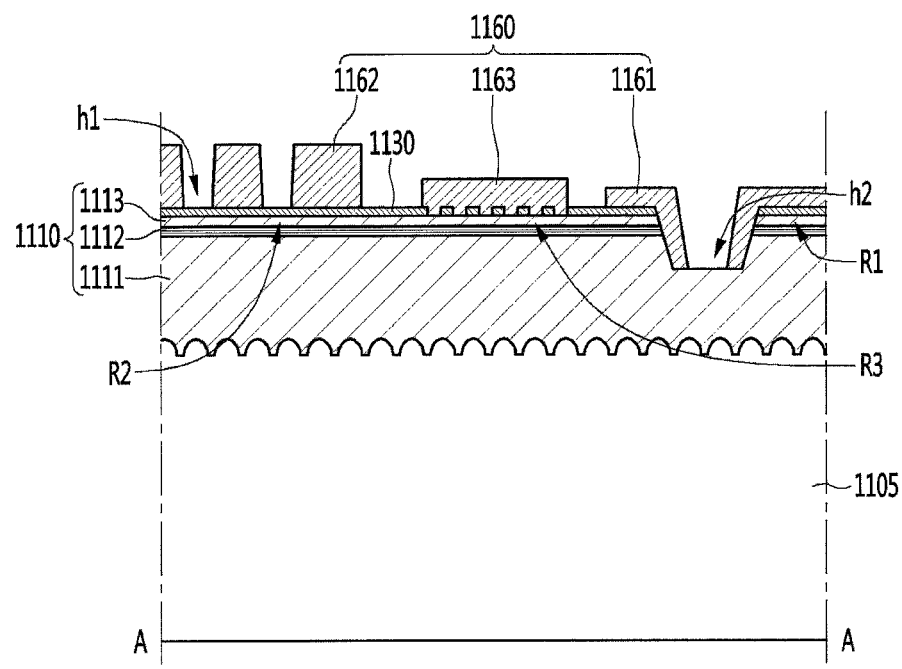

Next, as shown in FIGS. 35*a* and 35*b*, the reflective layer 1160 may be provided. FIG. 35*a* is a plan view showing a shape of the reflective layer 1160 formed according to the method of manufacturing the light emitting device according to the embodiment, and FIG. 35*b* is a process sectional view taken along line A-A of the light emitting device shown in FIG. 35*a*.

The reflective layer 1160 may include a first reflective layer 1161, a second reflective layer 1162, and a third reflective layer 1163. The reflective layer 1160 may be disposed on the ohmic contact layer 1130. The reflective layer 1160 may be disposed over the first conductive semiconductor layer 1111 and the second conductive semiconductor layer 1113.

The first reflective layer 1161 and the second reflective layer 1162 may be spaced apart from each other. The third reflective layer 1163 may be disposed between the first reflective layer 1161 and the second reflective layer 1162.

The first reflective layer 1161 may be disposed on the first region R1 of the ohmic contact layer 1130. The first reflective layer 1161 may be disposed on the first contact holes C1 provided in the ohmic contact layer 1130.

The second reflective layer 1162 may be disposed on the second region R2 of the ohmic contact layer 1130. The second reflective layer 1162 may be disposed on the second contact holes C2 provided in the ohmic contact layer 1130.

The third reflective layer 1163 may be disposed on the third region R3 of the ohmic contact layer 1130. The third reflective layer 1163 may be disposed on the third contact holes C3 provided in the ohmic contact layer 1130.

The second reflective layer 1162 may include openings. For example, the second reflective layer 1162 may include the first openings h1. The ohmic contact layer 1130 may be exposed through the first openings h1.

In addition, the first reflective layer 1161 may include the second openings h2. The upper surface of the first conductive semiconductor layer 1111 may be exposed through the plurality of second openings h2. The plurality of second openings h2 may be provided corresponding to the regions of the mesa openings M provided in the light emitting structure 1110. In addition, the plurality of second openings h2 may be provided corresponding to the regions of the openings M1 provided in the ohmic contact layer 1130.

In addition, according to the embodiment, the first reflective layer 1161 may be provided on the first region R1 of the ohmic contact layer 1130. In addition, the first reflective layer 1161 may make contact with the second conductive semiconductor layer 1113 through the first contact hole C1 provided in the ohmic contact layer 1130. Accordingly, the adhesive strength between the first reflective layer 1161 and the second conductive semiconductor layer 1113 may be improved, and the first reflective layer 1161 may be prevented from being peeled off from the ohmic contact layer 1130.

In addition, according to the embodiment, the second reflective layer 1162 may be provided on the second region R2 of the ohmic contact layer 1130. The second reflective layer 1162 may make contact with the second conductive semiconductor layer 1113 through the second contact hole C2 provided in the ohmic contact layer 1130. Accordingly, the adhesive strength between the second reflective layer 1162 and the second conductive semiconductor layer 1113 may be improved, and the second reflective layer 1162 may be prevented from being peeled off from the ohmic contact layer 1130.

In addition, according to the embodiment, the third reflective layer 1163 may be provided on the third region R3 of the ohmic contact layer 1130. The third reflective layer 1163 may make contact with the second conductive semiconductor layer 1113 through the third contact hole C3 provided in the ohmic contact layer 1130. Accordingly, the adhesive strength between the third reflective layer 1163 and the second conductive semiconductor layer 1113 may be improved, and the third reflective layer 1163 may be prevented from being peeled off from the ohmic contact layer 1130.

Figure 36A:
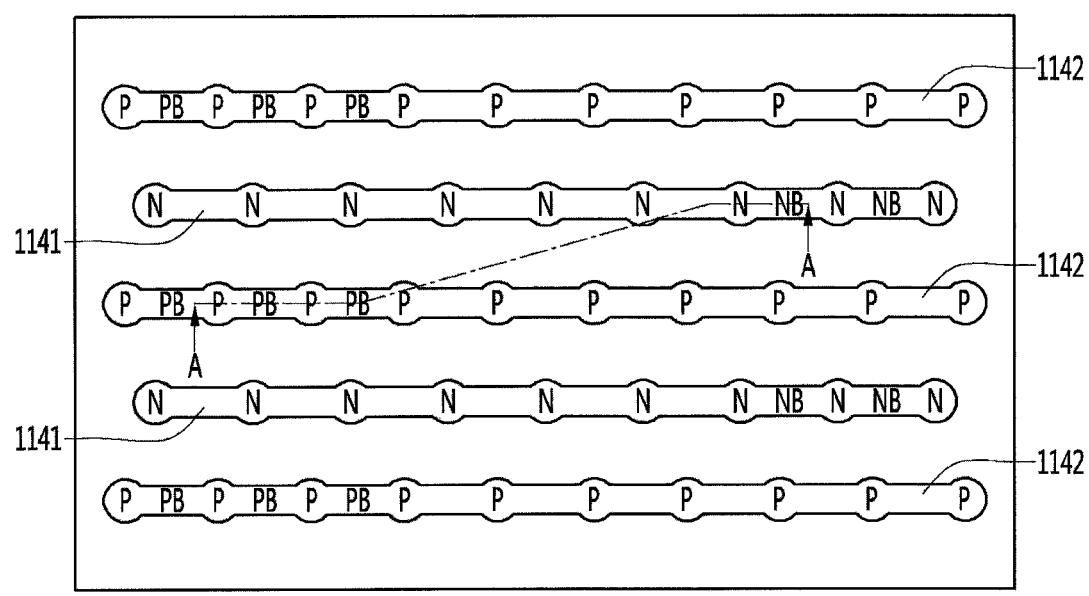
FIGS. 36a and 36b are views describing a step of forming a first sub-electrode and a second sub-electrode according to a method of manufacturing a light emitting device according to an embodiment of the present invention.
Figure 36B:
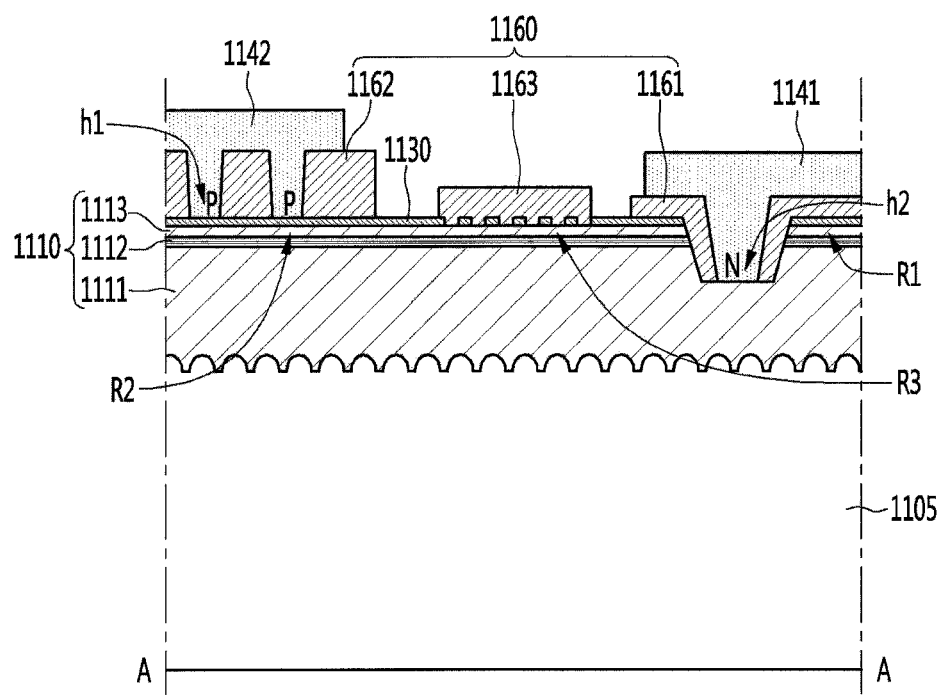

Subsequently, as shown in FIGS. 36a and 36b, the first sub-electrode 1141 and the second sub-electrode 1142 may be provided. FIG. 36a is a plan view showing shapes of the first sub-electrode 1141 and the second sub-electrode 1142 formed according to the method of manufacturing the light emitting device according to the embodiment, and FIG. 36b is a process sectional view taken along the line A-A of the light emitting device shown in FIG. 36a.

According to the embodiment, the first sub-electrode 1141 and the second sub-electrode 1142 may be spaced apart from each other.

The first sub-electrode 1141 may be electrically connected to the first conductive semiconductor layer 1111. The first sub-electrode 1141 may be disposed on the first conductive semiconductor layer 1111. For example, in the light emitting device 1100 according to the embodiment, the first sub-electrode 1141 may be disposed on the upper surface of the first conductive semiconductor layer 1111 which is exposed by removing a portion of the second conductive semiconductor layer 1113 and a portion of the active layer 1112.

For example, the first sub-electrode 1141 may be provided in a linear shape. In addition, the first sub-electrode 1141 may include an N region having an area relatively larger than other regions having the linear shape. The N region of the first sub-electrode 1141 may be electrically connected to the first electrode 1171 to be provided later.

The first sub-electrode 1141 may be electrically connected to the upper surface of the first conductive semiconductor layer 1111 through the second opening h2 provided in the first reflective layer 1161. For example, the first sub-electrode 1141 may make direct contact with the upper surface of the first conductive semiconductor layer 1111 in the N regions.

The second sub-electrode 1142 may be electrically connected to the second conductive semiconductor layer 1113. The second sub-electrode 1142 may be disposed on the second conductive semiconductor layer 1113. According to the embodiment, the ohmic contact layer 1130 may be disposed between the second sub-electrode 1142 and the second conductive semiconductor layer 1113.

For example, the second sub-electrode 1142 may be provided in a linear shape. In addition, the second sub-electrode 1142 may include a P region having an area relatively larger than other regions having the linear shape. The P region of the second sub-electrode 1142 may be electrically connected to the second electrode 1172 to be provided later.

The second sub-electrode 1142 may be electrically connected to the upper surface of the second conductive semiconductor layer 1113 through the first opening h1 provided in the second reflective layer 1162. For example, the second sub-electrode 1142 may be electrically connected to the second conductive semiconductor layer 1113 through the ohmic contact layer 1130 in the plurality of P regions. The second sub-electrode 1142 may make direct contact with the upper surface of the ohmic contact layer 1130 in the plurality of P regions.

Figure 37A:
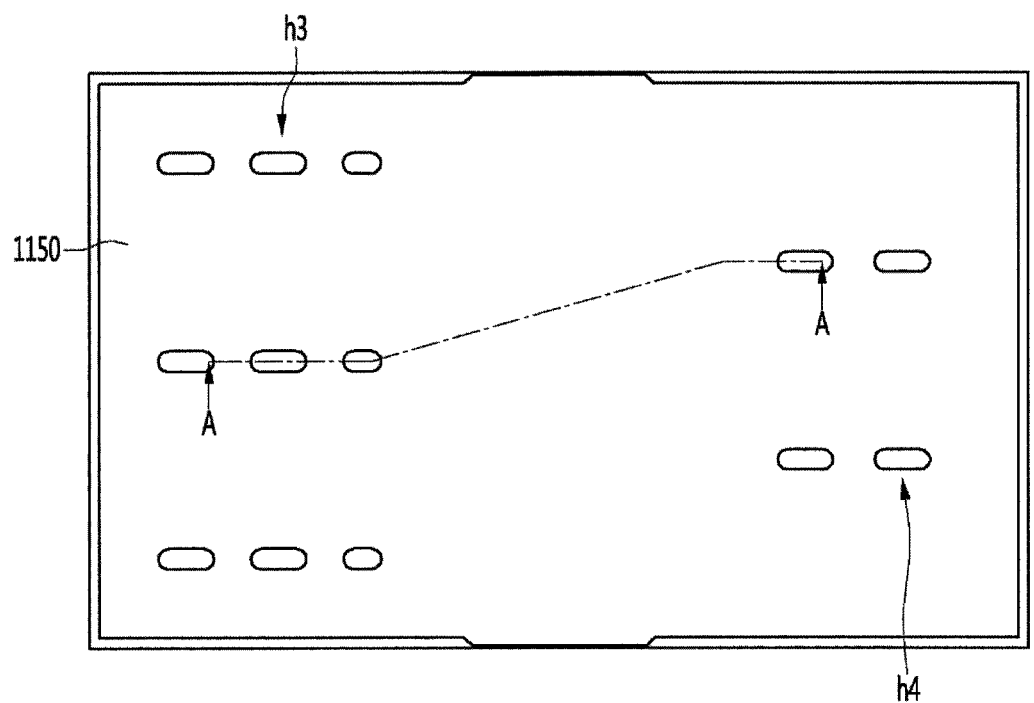
FIGS. 37a and 37b are views describing a step of forming a protective layer according to a method of manufacturing a light emitting device according to an embodiment of the present invention.
Figure 37B:
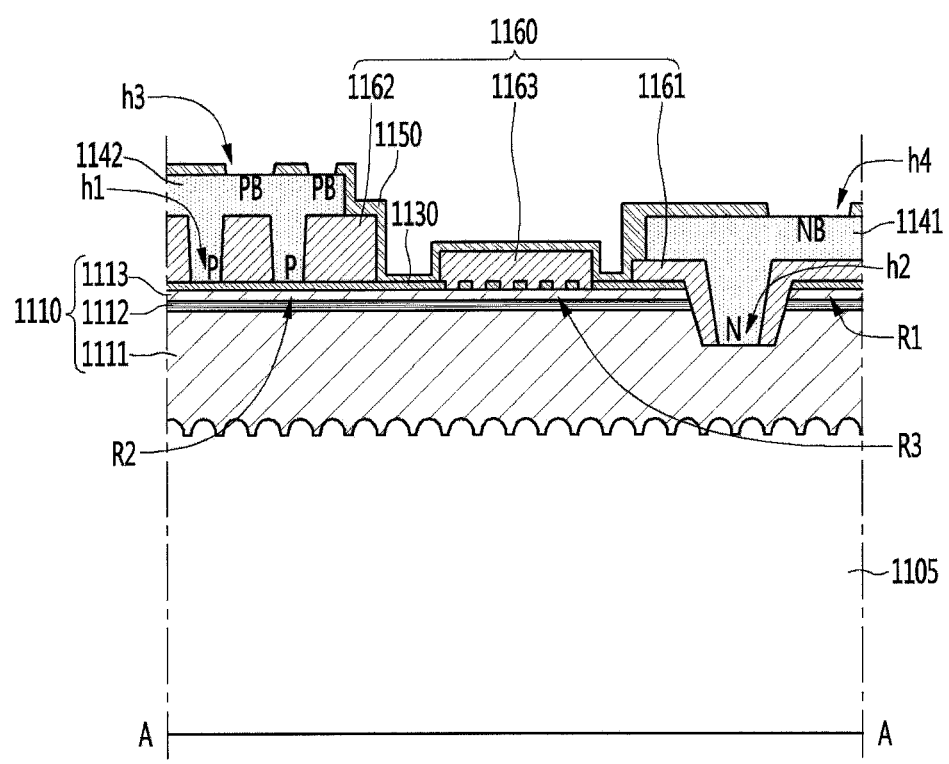

Next, as shown in FIGS. 37a and 37b, a reflective layer 1150 may be provided. FIG. 37a is a plan view showing a shape of the protective layer 1150 formed according to the method of manufacturing the light emitting device according to the embodiment, and FIG. 37b is a process sectional view taken along line A-A of the light emitting device shown in FIG. 37a.

The protective layer 1150 may be disposed on the first sub-electrode 1141 and the second sub-electrode 1142. The protective layer 1150 may be disposed on the reflective layer 1160.

The protective layer 1150 may include a fourth opening h4 for exposing the upper surface of the first sub-electrode 1141. The protective layer 1150 may include the fourth openings h4 for exposing a plurality of NB regions of the first sub-electrode 1141.

The fourth opening h4 may be provided on a region where the first reflective layer 1161 is disposed. In addition, the fourth opening h4 may be provided on the first region R1 of the ohmic contact layer 1130.

The protective layer 1150 may include the third opening h3 for exposing the upper surface of the second sub-electrode 1142. The protective layer 1150 may include the third openings h3 for exposing the PB regions of the second sub-electrode 1142.

The third opening h3 may be provided on a region where the second reflective layer 1162 is disposed. In addition, the third opening h3 may be provided on the second region R2 of the ohmic contact layer 1130.

Figure 38A:
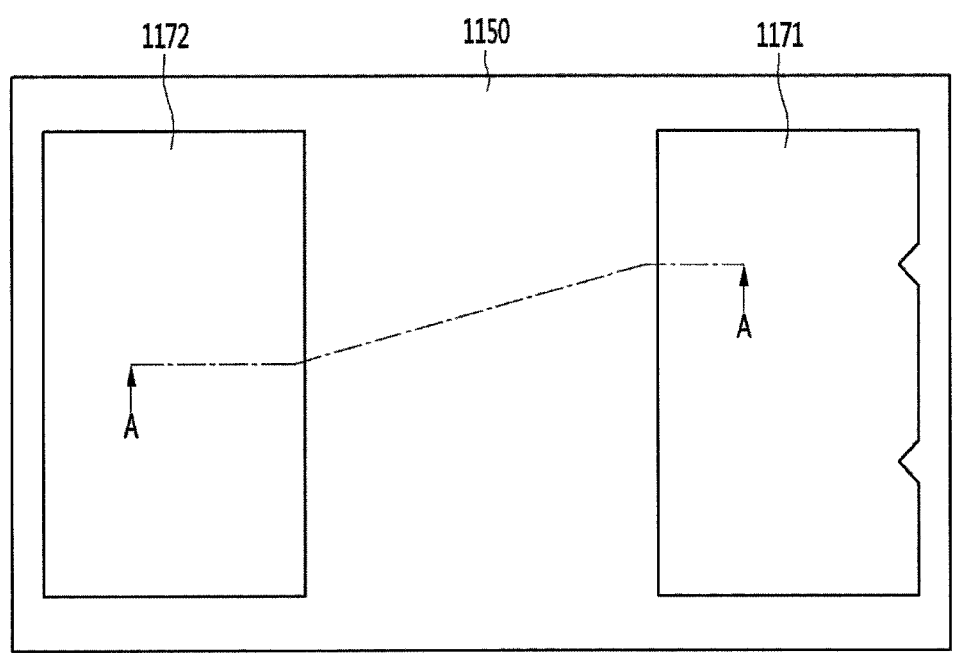
FIGS. 38a and 38b are views describing a step of forming a first electrode and a second electrode according to a method of manufacturing a light emitting device according to an embodiment of the present invention.
Figure 38B:
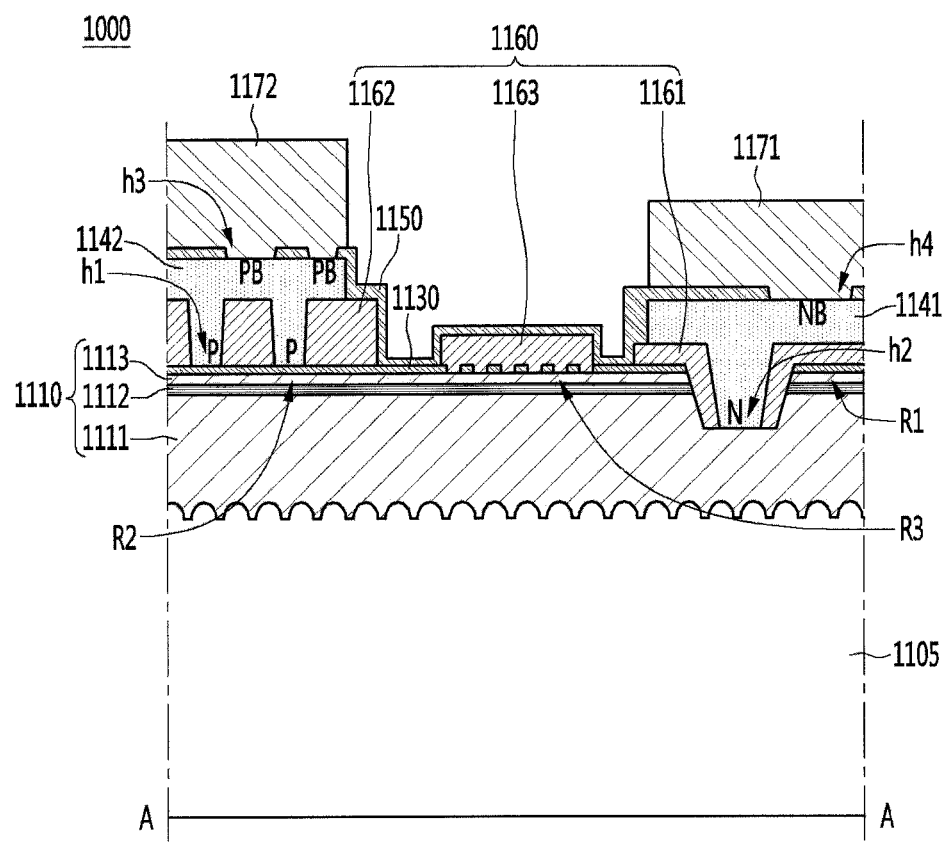

Subsequently, as shown in FIGS. 38a and 38b, the first electrode 1171 and the second electrode 1172 may be provided. FIG. 38a is a plan view showing shapes of the first electrode 1171 and the second electrode 1172 formed according to the method of manufacturing the light emitting device according to the embodiment, and FIG. 38b is a process sectional view taken along the line A-A of the light emitting device shown in FIG. 38a.

According to the embodiment, the first electrode 1171 and the second electrode 1172 may be provided in the shape shown in FIG. 38a. The first electrode 1171 and the second electrode 1172 may be disposed on the protective layer 1150.

The first electrode 1171 may be disposed on the first reflective layer 1161. The second electrode 1172 may be disposed on the second reflective layer 1162. The second electrode 1172 may be spaced apart from the first electrode 1171.

The first electrode 1171 may make contact with the upper surface of the first sub-electrode 1141 through the fourth opening h4 provided in the protective layer 1150 in the NB regions. The second electrode 1172 may make contact with the upper surface of the second sub-electrode 1142 through the third opening h3 provided in the protective layer 1150 in the PB regions.

According to the embodiment, the power is applied to the first electrode 1171 and the second electrode pad 172, so that the light emitting structure 1110 may emit light.

Thus, according to the light emitting device 1100 of the embodiment, the first electrode 1171 may make contact with the first sub-electrode 1141 in the multiple regions. In addition, the second electrode 1172 may make contact with the second sub-electrode 1142 in the multiple regions. Thus, according to the embodiment, because the power may be supplied through the regions, a current dispersion effect can be generated and an operating voltage can be reduced according to the increase of a contact area and the dispersion of a contact region.

The light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by anyone having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

The invention claimed is:

1. A light emitting device package comprising:
   a package body;
   a light emitting device disposed on the package body and including first and second electrode pads on a bottom surface of the light emitting device;
   a first through hole in the package body;
   a second through hole in the package body;
   a first recess disposed between the first through hole and the second through hole; and
   a second recess surrounding the first through hole and the second through hole,
   wherein the first through hole is separated from the second through hole,
   wherein the first electrode pad of the light emitting device directly overlaps with the first through hole in the package body, wherein the second electrode pad of the light emitting device directly overlaps with the second through hole in the package body, wherein the first recess is in an upper surface of the package body, and wherein the second recess is in the upper surface of the package body.

2. The light emitting device package of claim 1, further comprising:

a first resin disposed in the first recess, wherein the first resin contacts the bottom surface of the light emitting device and the upper surface of the package body.

3. The light emitting device package of claim 2, wherein the first resin contacts a first side surface of the first electrode pad and a second side surface of the second electrode pad.

4. The light emitting device package of claim 1, further comprising:

a second resin disposed in the second recess.

5. The light emitting device package of claim 4, wherein the first resin and the second resin include a same material.

6. The light emitting device package of claim 1, wherein the first recess is connected to the second recess.

7. The light emitting device package of claim 1, wherein the first recess is separated from the second recess.

8. The light emitting device package of claim 1, wherein the first recess has a first depth and the second recess has a second depth different than the first depth.

9. The light emitting device package of claim 1, further comprising:

a first conductive layer disposed in the first through hole and a second conductive layer disposed in the second through hole.

10. The light emitting device package of claim 9, further comprising:

a first metal layer disposed in the first through hole and in direct contact with the first electrode pad; and a second metal layer disposed in the second through hole and in direct contact with the second electrode pad, wherein the first metal layer is between the first conductive layer in the first through hole and the package body, and wherein the second metal layer is between the second conductive layer in the second through hole and the package body.

11. The light emitting device package of claim 1, wherein a lower width of the first through hole at a bottom surface of the package body is different than an upper width of the first through hole at the upper surface of the package body, and wherein a lower width of the second through hole at the bottom surface of the package body is different than an upper width of the second through hole at the upper surface of the package body.

12. A light emitting device package comprising:

a body including a first hole and a second hole being separated from the first hole;

a light emitting device on the body including a plurality of semiconductor layers comprising a light emitting structure, and a first electrode pad and a second electrode pad electrically connected to the light emitting structure respectively; and a resin disposed between the body and the light emitting device, wherein the first and second holes pass through an upper surface of the body and a lower surface of the body, respectively, wherein a width of the first hole and the second hole increase towards the lower surface of the body from the upper surface of the body, respectively, wherein the first electrode pad disposed on the first hole and the second electrode pad disposed on the second hole, wherein the body comprises an inner recess and an outer recess, wherein the inner recess is provided between the first hole and the second hole, and wherein the outer recess is provided to surround the first hole and the second hole.

13. The light emitting device package of claim 12, wherein an adhesive is disposed between the body and the light emitting device, and the adhesive is disposed while making direct contact with the body and the light emitting device.

14. The light emitting device package of claim 12, further comprising:

a first conductive layer provided in the first hole and disposed while making direct contact with a lower surface of the first electrode pad; and a second conductive layer provided in the second hole and disposed in direct contact with a lower surface of the second electrode pad.

15. The light emitting device package of claim 14, further comprising metal layers disposed between the body providing the first and second holes and the first and second conductive layers.

16. The light emitting device package of claim 12, further comprising:

a circuit board disposed below the body, and including a first pad and a second pad;

a first bonding layer electrically connecting the first pad of the circuit board and the first electrode pad; and a second bonding layer electrically connecting the second pad of the circuit board and the second electrode pad.

17. The light emitting device package of claim 16, wherein the first bonding layer is disposed in the first hole and disposed while making direct contact with the lower surface of the first electrode pad, and wherein the second bonding layer is disposed in the second hole and disposed while making direct contact with the lower surface of the second electrode pad.

18. The light emitting device package of claim 12, wherein a width of an upper region of the first hole is smaller than or equal to a width of the first electrode pad.

19. The light emitting device package of claim 12, wherein the resin is disposed in the outer recess.

20. The light emitting device package of claim 13, wherein the adhesive is disposed in the inner recess.

* * * * *